United States Patent
Watanabe

(10) Patent No.: US 11,648,643 B2
(45) Date of Patent: May 16, 2023

(54) METHOD, APPARATUS, AND SYSTEM FOR DETERMINING OPTIMUM OPERATION RECIPE FOR OPTICAL FILM-THICKNESS MEASURING DEVICE

(71) Applicant: EBARA CORPORATION, Tokyo (JP)

(72) Inventor: Yuki Watanabe, Tokyo (JP)

(73) Assignee: EBARA CORPORATION, Tokyo (JP)

(*) Notice: Subject to any disclaimer, the term of this patent is extended or adjusted under 35 U.S.C. 154(b) by 151 days.

(21) Appl. No.: 16/909,013

(22) Filed: Jun. 23, 2020

(65) Prior Publication Data

US 2020/0406422 A1 Dec. 31, 2020

(30) Foreign Application Priority Data

Jun. 27, 2019 (JP) .............................. JP2019-119895

(51) Int. Cl.
*B24B 49/05* (2006.01)
*H01L 21/66* (2006.01)
(Continued)

(52) U.S. Cl.
CPC ............ *B24B 49/05* (2013.01); *B24B 37/005* (2013.01); *B24B 49/12* (2013.01); *G06F 30/20* (2020.01);
(Continued)

(58) Field of Classification Search
CPC .......... G06F 30/20; B24B 49/05; B24B 49/12
See application file for complete search history.

(56) References Cited

U.S. PATENT DOCUMENTS

2007/0218812 A1* 9/2007 Benvegnu ............... B24B 49/12
257/E21.244
2013/0245985 A1* 9/2013 Flock .................... G05B 23/00
702/105

(Continued)

FOREIGN PATENT DOCUMENTS

JP      2004-154928 A    6/2004
JP      2010-093147 A    4/2010
(Continued)

OTHER PUBLICATIONS

Singapore Patent Application No. 10202006006U; Written Opinion Search Report; dated Mar. 17, 2023; 6 pages.

*Primary Examiner* — Alia Sabur
(74) *Attorney, Agent, or Firm* — BakerHostetler

(57) ABSTRACT

A method of automatically determining optimum recipe parameters constituting an operation recipe of an optical film-thickness measuring device within a short period of time is disclosed. The method includes storing in a memory a plurality of parameter sets each including a plurality of recipe parameters constituting an operation recipe; performing simulation of change in film thickness with polishing time with use of the plurality of parameter sets and data of reference spectra of reflected light from a polished substrate, the reference spectra being stored in a data server; inputting at least one index value for evaluating a manner of the change in film thickness into an evaluation calculation formula to calculate a plurality of comprehensive evaluation values for the plurality of parameter sets; and selecting an optimum one of the plurality of parameter sets based on the plurality of comprehensive evaluation values.

14 Claims, 16 Drawing Sheets

(51) Int. Cl.
     *H01L 21/67*      (2006.01)
     *H01L 21/306*     (2006.01)
     *B24B 37/005*     (2012.01)
     *B24B 49/12*      (2006.01)
     *G06F 30/20*      (2020.01)

(52) U.S. Cl.
     CPC ........ *H01L 21/30625* (2013.01); *H01L 21/67* (2013.01); *H01L 22/12* (2013.01); *H01L 22/26* (2013.01)

(56) References Cited

U.S. PATENT DOCUMENTS

| | | | |
|---|---|---|---|
| 2014/0176949 A1* | 6/2014 | David | G01J 3/46 |
| | | | 356/402 |
| 2017/0256463 A1 | 9/2017 | Bailey, III et al. | |
| 2019/0009385 A1 | 1/2019 | Hiroo et al. | |
| 2019/0311083 A1* | 10/2019 | Feng | G03F 1/36 |

FOREIGN PATENT DOCUMENTS

| | | |
|---|---|---|
| JP | 2010-120092 A | 6/2010 |
| JP | 2013-110390 A | 6/2013 |
| JP | 2015-156503 A | 8/2015 |
| WO | WO 2015/163164 A1 | 10/2015 |

* cited by examiner

METHOD, APPARATUS, AND SYSTEM FOR DETERMINING OPTIMUM OPERATION RECIPE FOR OPTICAL FILM-THICKNESS MEASURING DEVICE

CROSS REFERENCE TO RELATED APPLICATION

This document claims priority to Japanese Patent Application Number 2019-119895 filed Jun. 27, 2019 the entire contents of which are hereby incorporated by reference.

BACKGROUND

In a semiconductor device manufacturing process, films of various materials are repeatedly formed on a silicon wafer to form a multilayer structure. In order to form the multilayer structure, a technique of planarizing a surface of an uppermost layer is important. Chemical mechanical polishing (CMP) is one solution for such planarization.

The chemical mechanical polishing (CMP) is performed by a polishing apparatus. The polishing apparatus of this type generally includes a polishing table that supports a polishing pad, a polishing head for holding a substrate (for example, a wafer having a film), and a polishing-liquid supply nozzle for supplying a polishing liquid onto the polishing pad. When polishing a substrate, the polishing head presses a surface of the substrate against the polishing pad, while the polishing-liquid supply nozzle supplies the polishing liquid onto the polishing pad. The polishing head and the polishing table are rotated to provide a relative movement between the substrate and the polishing pad, thereby polishing a film that forms the surface of the substrate.

In order to measure a thickness of a non-metal film, such as a dielectric film or a silicon layer, the polishing apparatus generally includes an optical film-thickness measuring device. This optical film-thickness measuring device is configured to direct light, emitted by a light source, to the surface of the substrate, measure intensity of reflected light from the substrate with a spectrometer, and analyze a spectrum of the reflected light to determine a film thickness of the substrate.

The optical film-thickness measuring device operates according to an operation recipe. Therefore, a film-thickness measuring operation of the optical film-thickness measuring device may vary depending on the operation recipe. The operation recipe is usually produced by a user. However, there are many recipe parameters that make up the operation recipe, and therefore it takes time to optimize these recipe parameters. In particular, since a user adjusts the recipe parameters by trial and error, producing an optimal operation recipe not only takes a long time, but also depends on the skill of the user.

SUMMARY OF THE INVENTION

There are provided a method, an apparatus, and a system capable of automatically determining optimum recipe parameters constituting an operation recipe of an optical film-thickness measuring device within a short period of time.

Embodiments, which will be described below, relate to a method, an apparatus, and a system for determining an optimum operation recipe for an optical film-thickness measuring device configured to measure a film thickness of a substrate, such as a wafer, during polishing of the substrate.

In an embodiment, there is provided a method of determining an optimum operation recipe for an optical film-thickness measuring device configured to measure a film thickness of a substrate during polishing of the substrate, comprising: storing in a memory a plurality of parameter sets each including a plurality of recipe parameters constituting an operation recipe; performing simulation of change in film thickness with polishing time with use of the plurality of parameter sets and data of reference spectra of reflected light from a polished substrate, the reference spectra being stored in a data server; inputting at least one index value for evaluating a manner of the change in film thickness into an evaluation calculation formula to calculate a plurality of comprehensive evaluation values for the plurality of parameter sets; and selecting an optimum one of the plurality of parameter sets based on the plurality of comprehensive evaluation values.

In an embodiment, the evaluation calculation formula includes the at least one index value, at least one target value for the at least one index value, and at least one weighting factor multiplied by a difference between the at least one target value and the at least one index value.

In an embodiment, the plurality of recipe parameters includes at least two of: time width for calculating a moving average of spectra obtained during polishing of a substrate; the number of data points for use in calculating a spatial average of spectra obtained during polishing of a substrate; parameters of a filter applied to spectra obtained during polishing of a substrate; normalization parameter for normalizing spectra obtained during polishing of a substrate; wavelength range of spectrum for use in film thickness determination; and the number of a spectrum group that contains reference spectra for use in film thickness determination.

In an embodiment, the at least one index value comprises at least one of: a first index value indicating evaluation for invariance of a shape of a film-thickness profile with respect to polishing time; a second index value indicating evaluation for smallness of a difference between an actually-measured value of a film thickness measured by a film-thickness measuring module and a film thickness obtained by the simulation; a third index value indicating evaluation for goodness of fit in shape between a spectrum produced in the simulation and a reference spectrum stored in the data server; a fourth index value indicating evaluation for a quality factor of a film thickness determined based on a spectrum produced in the simulation; and a fifth index value indicating evaluation for a linearity of the change in film thickness along polishing time.

In an embodiment, the reference spectra stored in the data server are spectra of reflected light that have been obtained when a plurality of substrates are actually polished.

In an embodiment, the method further comprises: repeating the simulation and calculation of the comprehensive evaluation value for the plurality of substrates to obtain a plurality of comprehensive evaluation values for each parameter set; and calculating a variation in the plurality of comprehensive evaluation values for each parameter set, wherein said selecting the optimum one of the plurality of parameter sets comprises selecting, from the plurality of parameter sets, an optimum parameter set with a smallest variation in the plurality of comprehensive evaluation values.

In an embodiment, the method further comprises: repeating the simulation and calculation of the comprehensive evaluation value for the plurality of substrates to obtain a plurality of comprehensive evaluation values for each parameter set; and calculating a sum of the plurality of comprehensive evaluation values for each parameter set, wherein said selecting the optimum one of the plurality of parameter sets comprises selecting, from the plurality of parameter sets, an optimum parameter set with a largest or smallest sum of the plurality of comprehensive evaluation values.

In an embodiment, there is provided a system for determining an optimum operation recipe for an optical film-thickness measuring device configured to measure a film thickness of a substrate during polishing of the substrate, comprising: a recipe evaluation device including a memory storing a program therein and a processor configured to perform an arithmetic operation according to an instruction contained in the program, the memory storing therein a plurality of parameter sets each including a plurality of recipe parameters constituting an operation recipe; and a data server storing therein data of reference spectra of reflected light from a polished substrate, wherein the recipe evaluation device is configured to perform simulation of change in film thickness with polishing time with use of the plurality of parameter sets and the data of the reference spectra obtained from the data server, input at least one index value for evaluating a manner of the change in film thickness into an evaluation calculation formula to calculate a plurality of comprehensive evaluation values for the plurality of parameter sets, and select an optimum one of the plurality of parameter sets based on the plurality of comprehensive evaluation values.

In an embodiment, the evaluation calculation formula includes the at least one index value, at least one target value for the at least one index value, and at least one weighting factor multiplied by a difference between the at least one target value and the at least one index value.

In an embodiment, the plurality of recipe parameters includes at least two of: time width for calculating a moving average of spectra obtained during polishing of a substrate; the number of data points for use in calculating a spatial average of spectra obtained during polishing of a substrate; parameters of a filter applied to spectra obtained during polishing of a substrate; normalization parameter for normalizing spectra obtained during polishing of a substrate; wavelength range of spectrum for use in film thickness determination; and the number of a spectrum group that contains reference spectra for use in film thickness determination.

In an embodiment, the at least one index value comprises at least one of: a first index value indicating evaluation for invariance of a shape of a film-thickness profile with respect to polishing time; a second index value indicating evaluation for smallness of a difference between an actually-measured value of a film thickness measured by a film-thickness measuring module and a film thickness obtained by the simulation; a third index value indicating evaluation for goodness of fit in shape between a spectrum produced in the simulation and a reference spectrum stored in the data server; a fourth index value indicating evaluation for a quality factor of a film thickness determined based on a spectrum produced in the simulation; and a fifth index value indicating evaluation for a linearity of the change in film thickness along polishing time.

In an embodiment, the reference spectra stored in the data server are spectra of reflected light that have been obtained when a plurality of substrates are actually polished.

In an embodiment, the recipe evaluation device is configured to repeat the simulation and calculation of the comprehensive evaluation value for the plurality of substrates to obtain a plurality of comprehensive evaluation values for each parameter set, calculate a variation in the plurality of comprehensive evaluation values for each parameter set, and select, from the plurality of parameter sets, an optimum parameter set with a smallest variation in the plurality of comprehensive evaluation values.

In an embodiment, the recipe evaluation device is configured to repeat the simulation and calculation of the comprehensive evaluation value for the plurality of substrates to obtain a plurality of comprehensive evaluation values for each parameter set, calculate a sum of the plurality of comprehensive evaluation values for each parameter set, and select, from the plurality of parameter sets, an optimum parameter set with a smallest sum of the plurality of comprehensive evaluation values.

In an embodiment, there is provided a recipe evaluation device for determining an optimum operation recipe for an optical film-thickness measuring device configured to measure a film thickness of a substrate during polishing of the substrate, comprising: a memory storing therein a program and a plurality of parameter sets each including a plurality of recipe parameters constituting an operation recipe; and a processor configured to perform an arithmetic operation according to an instruction contained in the program, wherein the processor is configured to perform simulation of change in film thickness with polishing time with use of the plurality of parameter sets and data of reference spectra of reflected light from a polished substrate, the data being obtained from a data server storing the data therein, input at least one index value for evaluating a manner of the change in film thickness into an evaluation calculation formula to calculate a plurality of comprehensive evaluation values for the plurality of parameter sets, and select an optimum one of the plurality of parameter sets based on the plurality of comprehensive evaluation values.

In an embodiment, the evaluation calculation formula includes the at least one index value, at least one target value for the at least one index value, and at least one weighting factor multiplied by a difference between the at least one target value and the at least one index value.

The comprehensive evaluation values for the parameter sets are calculated using the evaluation calculation formula. Therefore, regardless of the skill of a user, the optimum recipe parameters can be automatically determined in a short time based on the comprehensive evaluation values.

DESCRIPTION OF EMBODIMENTS

Figure 1:
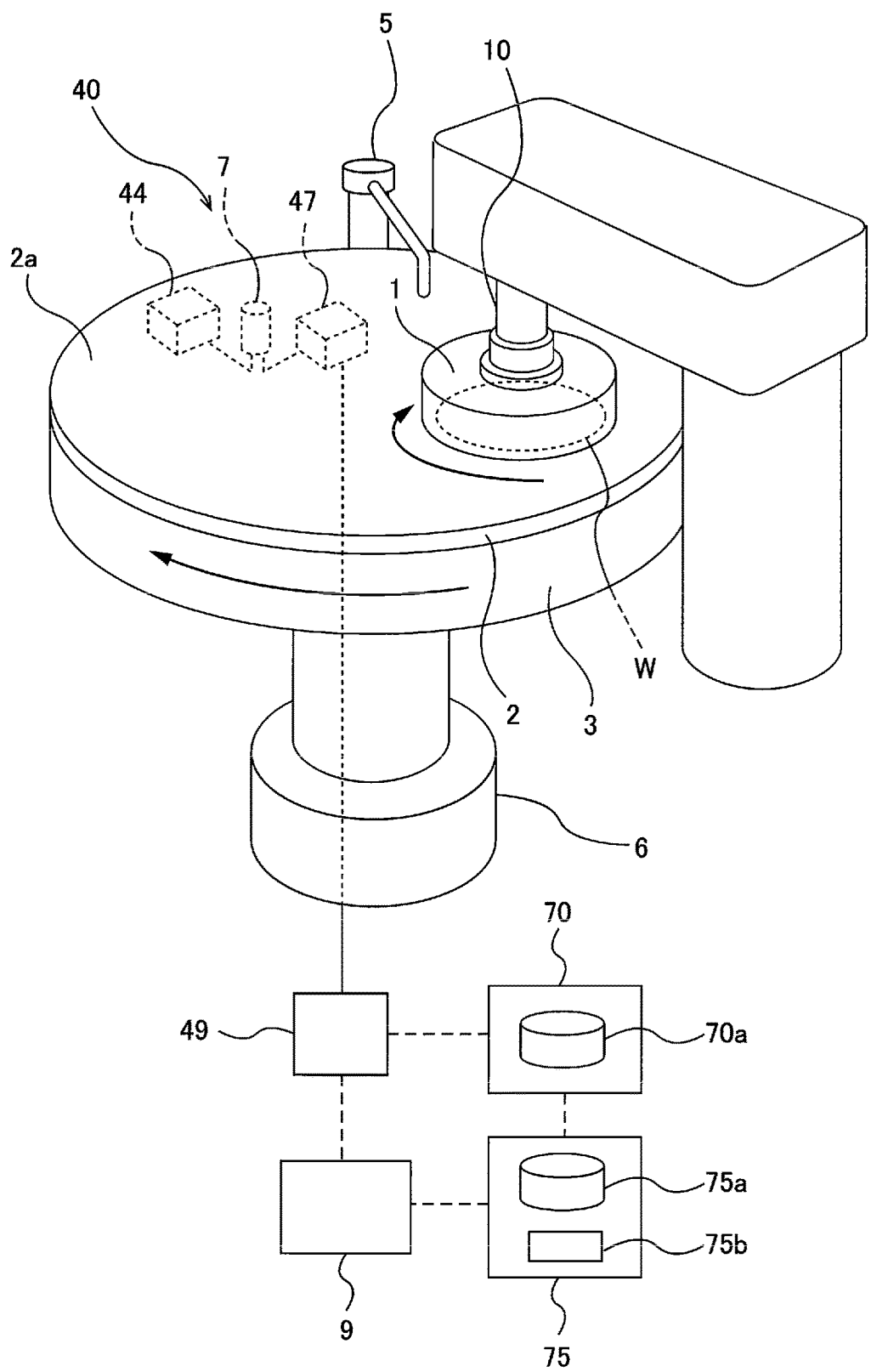
FIG. 1 is a schematic view showing an embodiment of a polishing apparatus.

Embodiments will be described below with reference to the drawings. FIG. 1 is schematic view showing an embodiment of a polishing apparatus. As shown in FIG. 1, the polishing apparatus includes a polishing table 3 for supporting a polishing pad 2, a polishing head 1 configured to press a wafer W, which is an example of a substrate, against the polishing pad 2, a table motor 6 configured to rotate the polishing table 3, and a slurry supply nozzle 5 arranged to supply slurry onto the polishing pad 2. The polishing pad 2 has an upper surface constituting a polishing surface 2a for polishing the wafer W.

The polishing head 1 is coupled to a head shaft 10, and the polishing head 1 rotates together with the head shaft 10 in a direction indicated by an arrow. The polishing table 3 is coupled to the table motor 6, which is configured to rotate the polishing table 3 and the polishing pad 2 in a direction indicated by an arrow.

Polishing of the wafer W is performed as follows. The slurry supply nozzle 5 supplies the slurry onto the polishing surface 2a of the polishing pad 2 on the polishing table 3, while the polishing head 3 and the polishing head 1 are rotated in directions indicated by the arrows in FIG. 1. While the wafer W is being rotated by the polishing head 1, the wafer W is pressed against the polishing surface 2a of the polishing pad 2 in the presence of the slurry on the polishing pad 2. The surface of the wafer W is polished by a chemical action of the slurry and a mechanical action of abrasive grains contained in the slurry.

The polishing apparatus includes an optical film-thickness measuring device 40 configured to detect a film thickness of the wafer W. The optical film-thickness measuring device 40 includes an optical sensor head 7, a light source 44 for emitting light, a spectrometer 47, and a spectrum processing device 49. The optical sensor head 7, the light source 44, and the spectrometer 47 are secured to the polishing table 3, and rotate together with the polishing table 3 and the polishing pad 2. The position of the optical sensor head 7 is such that the optical sensor head 7 sweeps across the surface of the wafer W on the polishing pad 2 each time the polishing table 3 and the polishing pad 2 make one rotation.

The light emitted by the light source 44 is transmitted to the optical sensor head 7, which directs the light to the surface of the wafer W. The light is reflected off the surface of the wafer W, and the reflected light is received by the optical sensor head 7 and is further transmitted to the spectrometer 47. The spectrometer 47 decomposes the reflected light according to wavelength, and measures an intensity of the reflected light at each of wavelengths. The intensity measurement data of the reflected light is transmitted to the spectrum processing device 49. The spectrum processing device 49 produces a spectrum of the reflected light from the intensity measurement data of the reflected light, and determines the film thickness of the wafer W based on this spectrum.

The spectrum processing device 49 is coupled to a data server 70 including a storage device 70a that stores data of spectra of the reflected light from the wafer W. The data server 70 stores not only the spectra of the reflected light from the wafer W currently being polished, but also data of spectra of reflected light from a plurality of wafers that have been previously polished in the past. The data server 70 is coupled to a recipe evaluation device 75, which is configured to determine an optimum operation recipe for the optical film-thickness measuring device 40. The spectrum processing device 49 is coupled to a polishing controller 9 for controlling an operation of polishing the wafer W. The polishing controller 9 controls the polishing operation for the wafer W based on the film thickness of the wafer W determined by the spectrum processing device 49. For example, the polishing controller 9 determines a polishing end point at which the film thickness of the wafer W reaches a target film thickness, or changes a polishing condition for the wafer W when the film thickness of the wafer W reaches a predetermined value.

Figure 2:
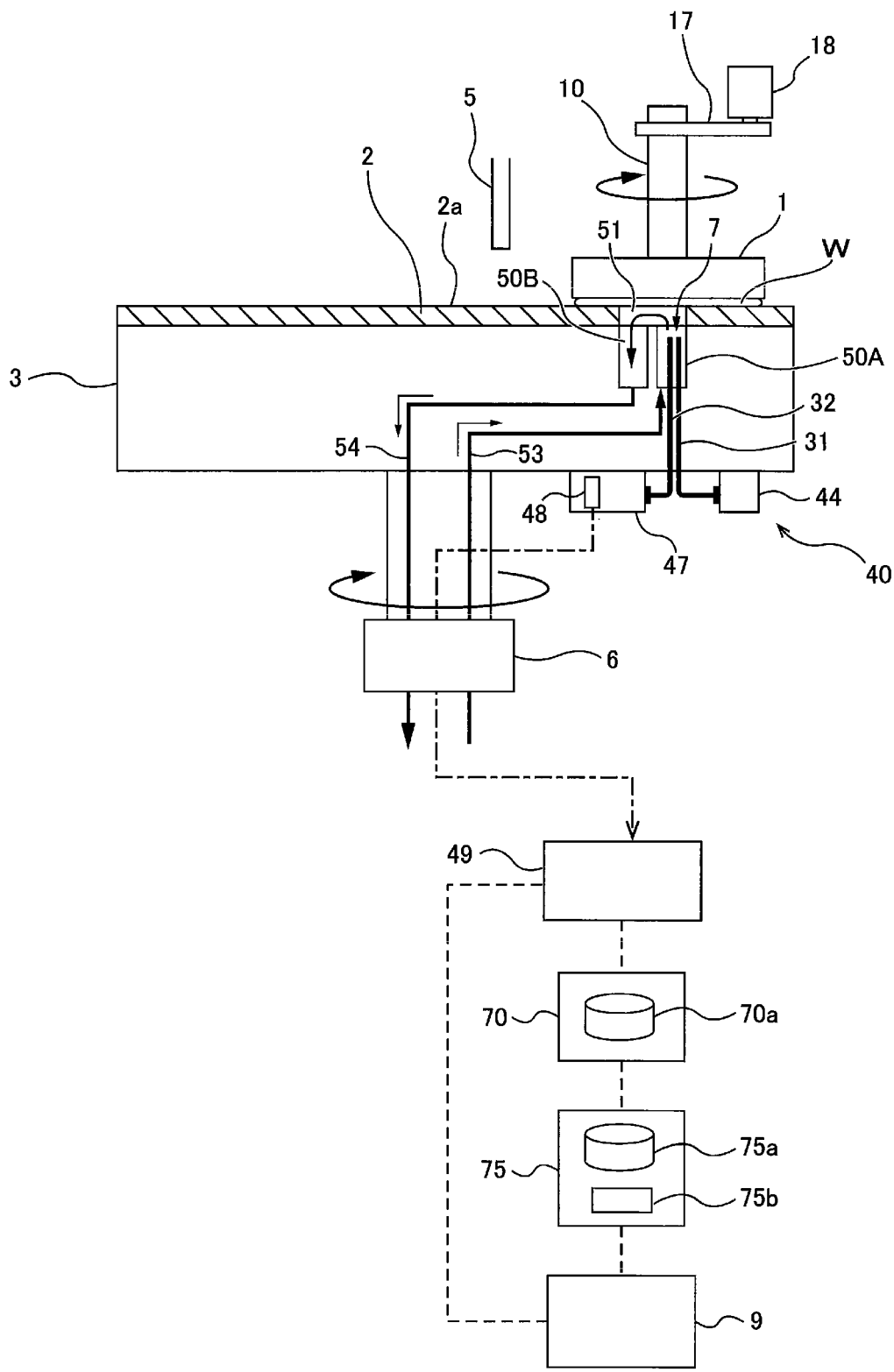
FIG. 2 is a cross-sectional view showing an embodiment of detailed configurations of the polishing apparatus shown in FIG. 1.

FIG. 2 is a cross-sectional view showing an embodiment of detailed configurations of the polishing apparatus shown in FIG. 1. The head shaft 10 is coupled to a polishing head motor 18 through a coupling device 17, such as belt, so that the head shaft 10 is rotated by the polishing head motor 18. This rotation of the head shaft 10 is transmitted to the polishing head 1 to rotate the polishing head 1 in the direction indicated by the arrow.

The spectrometer 47 includes a light detector 48. In one embodiment, the light detector 48 is constituted by photodiode, CCD, or CMOS. The optical sensor head 7 is optically coupled to the light source 44 and the light detector 48. The light detector 48 is electrically coupled to the spectrum processing device 49.

The optical film-thickness measuring device 40 further includes a light-emitting optical fiber cable 31 arranged to direct the light, emitted by the light source 44, to the surface of the wafer W, and a light-receiving optical fiber cable 32 arranged to receive the reflected light from the wafer W and transmit the reflected light to the spectrometer 47. An end of the light-emitting optical fiber cable 31 and an end of the light-receiving optical fiber cable 32 are located in the polishing table 3.

The end of the light-emitting optical fiber cable 31 and the end of the light-receiving optical fiber cable 32 constitute the optical sensor head 7 that directs the light to the surface of the wafer W and receives the reflected light from the wafer W. The other end of the light-emitting optical fiber cable 31 is coupled to the light source 44, and the other end of the light-receiving optical fiber cable 32 is coupled to the spectrometer 47. The spectrometer 47 is configured to decompose the reflected light from the wafer W according to wavelength and measure intensities of the reflected light over a predetermined wavelength range.

The light source 44 transmits the light to the optical sensor head 7 through the light-emitting optical fiber cable 31, and the optical sensor head 7 emits the light to the wafer W. The reflected light from the wafer W is received by the optical sensor head 7 and transmitted to the spectrometer 47 through the light-receiving optical fiber cable 32. The spectrometer 47 decomposes the reflected light according to its wavelength and measures the intensity of the reflected light at each of the wavelengths. The spectrometer 47 sends intensity measurement data of the reflected light to the spectrum processing device 49.

The spectrum processing device 49 produces a spectrum of the reflected light from the intensity measurement data of the reflected light. This spectrum indicates a relationship between the intensity and the wavelength of the reflected light, and the shape of the spectrum varies according to a film thickness of the wafer W. The spectrum processing device 49 determines the film thickness of the wafer W based on the spectrum of the reflected light. A known technique is used to determine the film thickness of the wafer W based on the spectrum of the reflected light. For example, the spectrum processing device 49 determines a reference spectrum which is closest in shape to the spectrum of the reflected light and determines a film thickness associated with the determined reference spectrum. In another example, the spectrum processing device 49 may perform Fourier transform on the spectrum of the reflected light to obtain a frequency spectrum and determine a film thickness from the frequency spectrum obtained.

The polishing table 3 has a first hole 50A and a second hole 50B which open in an upper surface of the polishing table 3. The polishing pad 2 has a through-hole 51 at a position corresponding to the holes 50A and 50B. The holes 50A and 50B are in fluid communication with the through-hole 51, which opens in the polishing surface 2a. The first hole 50A is coupled to a liquid supply line 53. The second hole 50B is coupled to a drain line 54. The optical sensor head 7, composed of the end of the light-emitting optical fiber cable 31 and the end of the light-receiving optical fiber cable 32, is located in the first hole 50A, and is located below the through-hole 51.

The light-emitting optical fiber cable 31 is an optical transmission element for transmitting the light, emitted by the light source 44, to the surface of the wafer W. The distal ends of the light-emitting optical fiber cable 31 and the light-receiving optical fiber cable 32 lie in the first hole 50A, and are located near the surface, to be polished, of the wafer W. The optical sensor head 7, composed of the distal end of the light-emitting optical fiber cable 31 and the light-receiving optical fiber cable 32, is arranged so as to face the wafer W held by the polishing head 1, so that multiple measurement points of the wafer W are irradiated with the light each time the polishing table 3 makes one revolution. Only one optical sensor head 7 is provided in the polishing table 3 in this embodiment, while a plurality of optical sensor heads 7 may be provided in the polishing table 3.

During polishing of the wafer W, each time the polishing table 3 makes one revolution, the optical sensor head 7 sweeps across the wafer W. While the optical sensor head 7 is located below the wafer W, the light source 44 emits the light at predetermined intervals. The light is directed to the surface (i.e., the surface to be polished) of the wafer W and the reflected light from the wafer W is received by the optical sensor head 7 and is transmitted to the spectrometer 47. The spectrometer 47 measures the intensity of the reflected light at each of the wavelengths over the predetermined wavelength range and sends the intensity measurement data of the reflected light to the spectrum processing device 49. The spectrum processing device 49 produces a spectrum of the reflected light showing the light intensities at the respective wavelengths from the intensity measurement data, and determines the film thickness of the wafer W from the spectrum of the reflected light.

During the polishing of the wafer W, pure water as a rinsing liquid is supplied into the first hole 50A through the liquid supply line 53, and further supplied into the through-hole 51 through the first hole 50A. The pure water fills a space between the surface (i.e., the surface to be polished) of the wafer W and the optical sensor head 7. The pure water flows into the second hole 50B and is discharged through the drain line 54. The pure water flowing in the first hole 50A and the through-hole 51 prevents the slurry from entering the first hole 50A, thereby securing an optical path.

Figure 3:
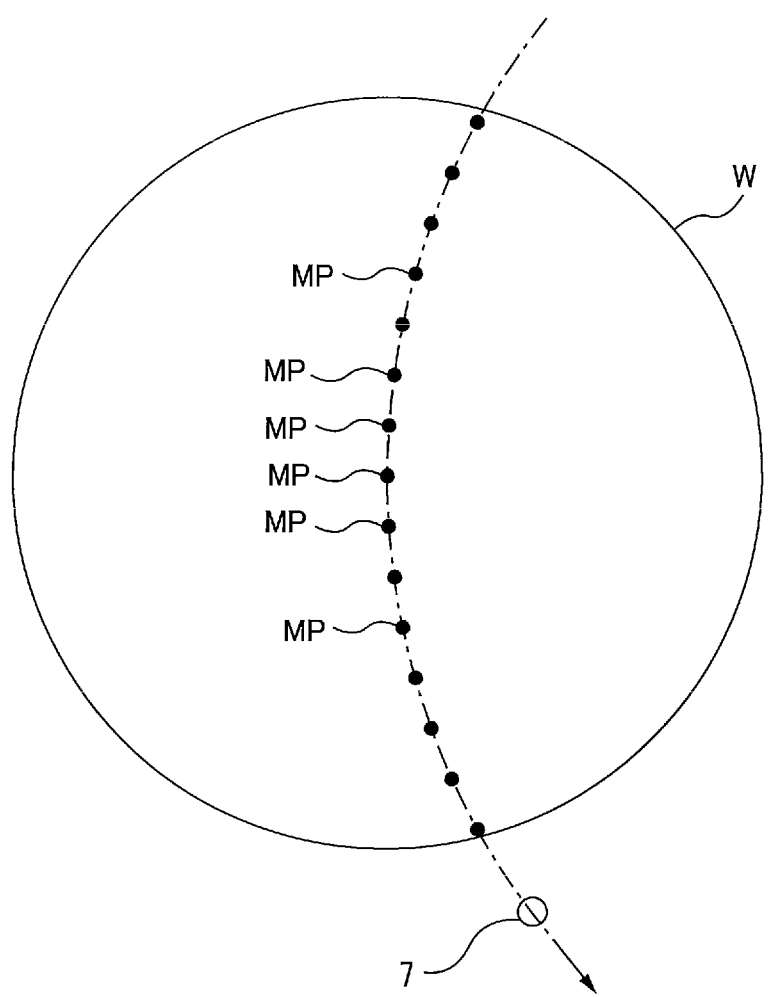
FIG. 3 is a schematic view showing a path of an optical sensor head when moving across a surface of a wafer.

FIG. 3 is a diagram showing a path of the optical sensor head 7 when moving across the surface of the wafer W. As shown in FIG. 3, during polishing the wafer W, each time the polishing table 3 makes one rotation, the optical sensor head 7 irradiates multiple measurement points MP on the wafer W with the light and receives the reflected light from the wafer W, while the optical sensor head 7 is moving across the wafer W.

Figure 4:
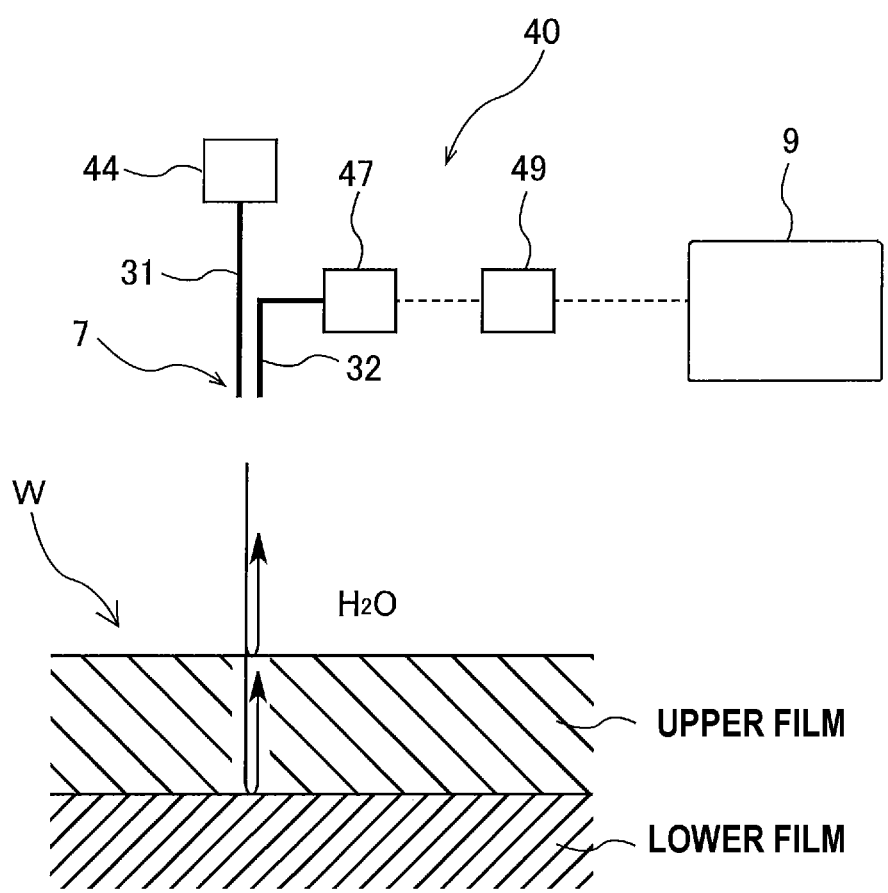
FIG. 4 is a schematic view illustrating a principle of an optical film-thickness measuring device.
Figure 5:
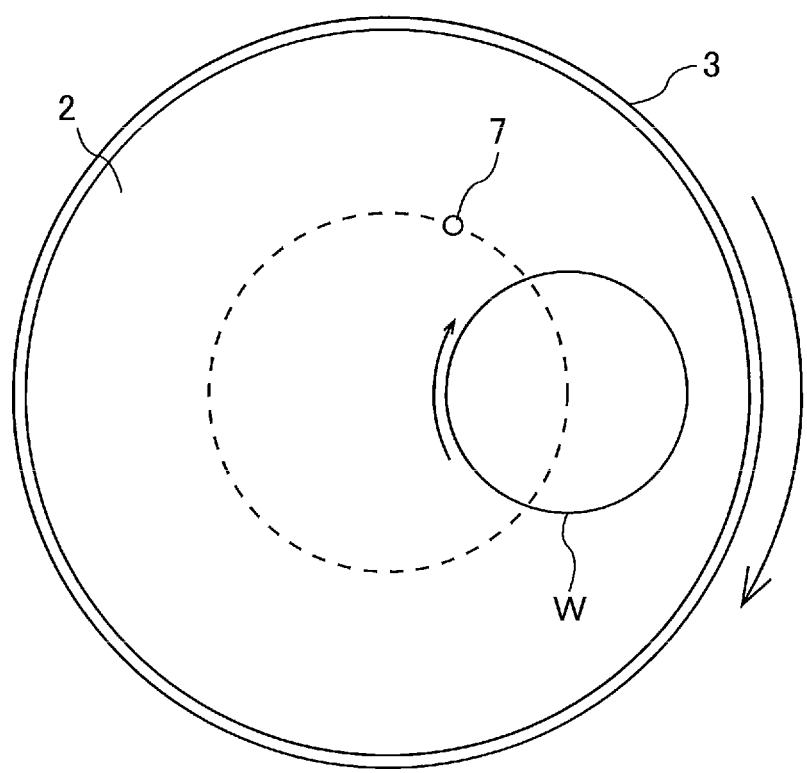
FIG. 5 is a plan view showing a positional relationship between a wafer and a polishing table.

FIG. 4 is a schematic view illustrating the principle of the optical film-thickness measuring device 40, and FIG. 5 is a plan view showing a positional relationship between the wafer W and the polishing table 3. In this example shown in FIG. 4, the wafer W has a lower film and an upper film formed on the lower film. The upper film is, for example, a silicon layer or a dielectric film. The optical sensor heard 7, which is composed of the distal ends of the light-emitting optical fiber cable 31 and the light-receiving optical fiber cable 32, is oriented toward the surface of the wafer W. The optical sensor heard 7 is arranged so as to direct the light to multiple areas, including the center, of the wafer W each time the polishing table 3 makes one revolution.

The light, which is cast on the wafer W, is reflected off an interface between a medium (e.g., water in the example of FIG. 4) and the upper film and an interface between the upper film and the lower film. Light waves from these interfaces interfere with each other. The manner of interference between the light waves varies according to the thickness of the upper film (i.e., a length of an optical path). As a result, the spectrum, produced from the reflected light from the wafer, varies according to the thickness of the upper film. The spectrometer 47 breaks up the reflected light according to the wavelength and measures the intensity of the reflected light at each of the wavelengths. The spectrum processing device 49 produces the spectrum from the intensity measurement data of the reflected light (i.e., optical signals)

obtained from the spectrometer 47. Hereinafter, a spectrum of the reflected light from the wafer W to be polished may be referred to as measurement spectrum. This measurement spectrum is expressed as a line graph (i.e., a spectral waveform) indicating a relationship between the wavelength and the intensity of the light. The intensity of the light can also be expressed as a relative value, such as a reflectance or a relative reflectance.

Figure 6:
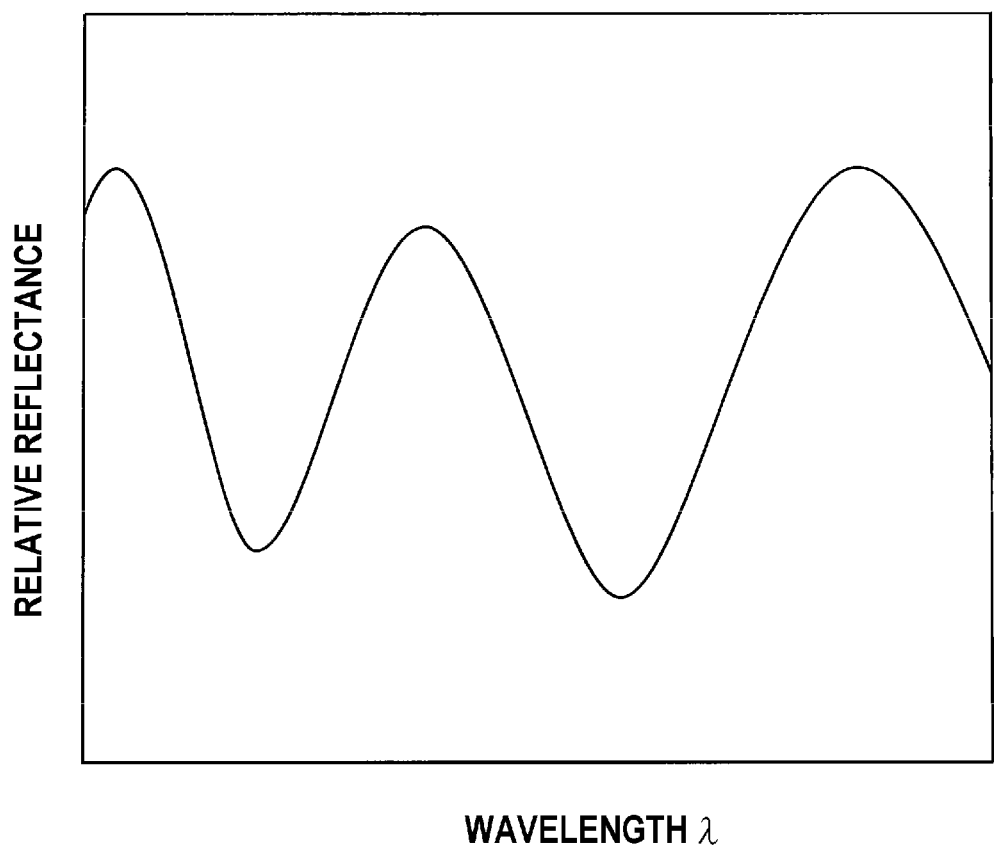
FIG. 6 is a diagram showing a measurement spectrum generated by a spectrum processing device.

FIG. 6 is a diagram showing a measurement spectrum created by the spectrum processing device 49. In FIG. 6, horizontal axis represents wavelength of the light reflected from the wafer, and vertical axis represents relative reflectance derived from the intensity of the reflected light. The relative reflectance is an index value that represents the intensity of the reflected light. Specifically, the relative reflectance is a ratio of the intensity of the light to a predetermined reference intensity. By dividing the intensity of the light (i.e., the actually measured intensity) at each wavelength by a predetermined reference intensity, unwanted noises, such as a variation in the intensity inherent in an optical system or the light source of the apparatus, are removed from the actually measured intensity.

The reference intensity is an intensity that has been measured in advance at each of the wavelengths. The relative reflectance is calculated at each of the wavelengths. Specifically, the relative reflectance is determined by dividing the intensity of the light (the actually measured intensity) at each wavelength by the corresponding reference intensity. The reference intensity is, for example, obtained by directly measuring the intensity of light emitted from the optical sensor head 7, or by irradiating a mirror with light from the optical sensor head 7 and measuring the intensity of reflected light from the mirror. Alternatively, the reference intensity may be an intensity of the reflected light which is measured by the spectrometer 47 when a silicon wafer (bare wafer) with no film thereon is being water-polished in the presence of water on the polishing pad 2, or when the silicon wafer (bare wafer) is placed on the polishing pad 2.

In the actual polishing process, a dark level (which is a background intensity obtained under the condition that light is cut off) is subtracted from the actually measured intensity to determine a corrected actually measured intensity. Further, the dark level is subtracted from the reference intensity to determine a corrected reference intensity. Then the relative reflectance is calculated by dividing the corrected actually measured intensity by the corrected reference intensity. Specifically, the relative reflectance $R(\lambda)$ can be calculated by using the following formula (1)

$$R(\lambda) = \frac{E(\lambda) - D(\lambda)}{B(\lambda) - D(\lambda)} \quad (1)$$

where $\lambda$ is wavelength, $E(\lambda)$ is the intensity of the light reflected from the wafer at the wavelength $\lambda$, $B(\lambda)$ is the reference intensity at the wavelength $\lambda$, and $D(\lambda)$ is the background intensity (i.e., dark level) at the wavelength 2 obtained under the condition that light is cut off.

In this embodiment, the spectrum processing device 49 is configured to determine a film thickness from a comparison between the measurement spectrum and a plurality of reference spectra. The reference spectra are stored in the storage device 70a of the data server 70 shown in FIG. 1 and FIG. 2. The spectrum processing device 49 accesses the data server 70, compares the measurement spectrum produced during polishing the wafer W with the plurality of reference spectra, and selects a reference spectrum which is closest in shape to the measurement spectrum.

Figure 7:
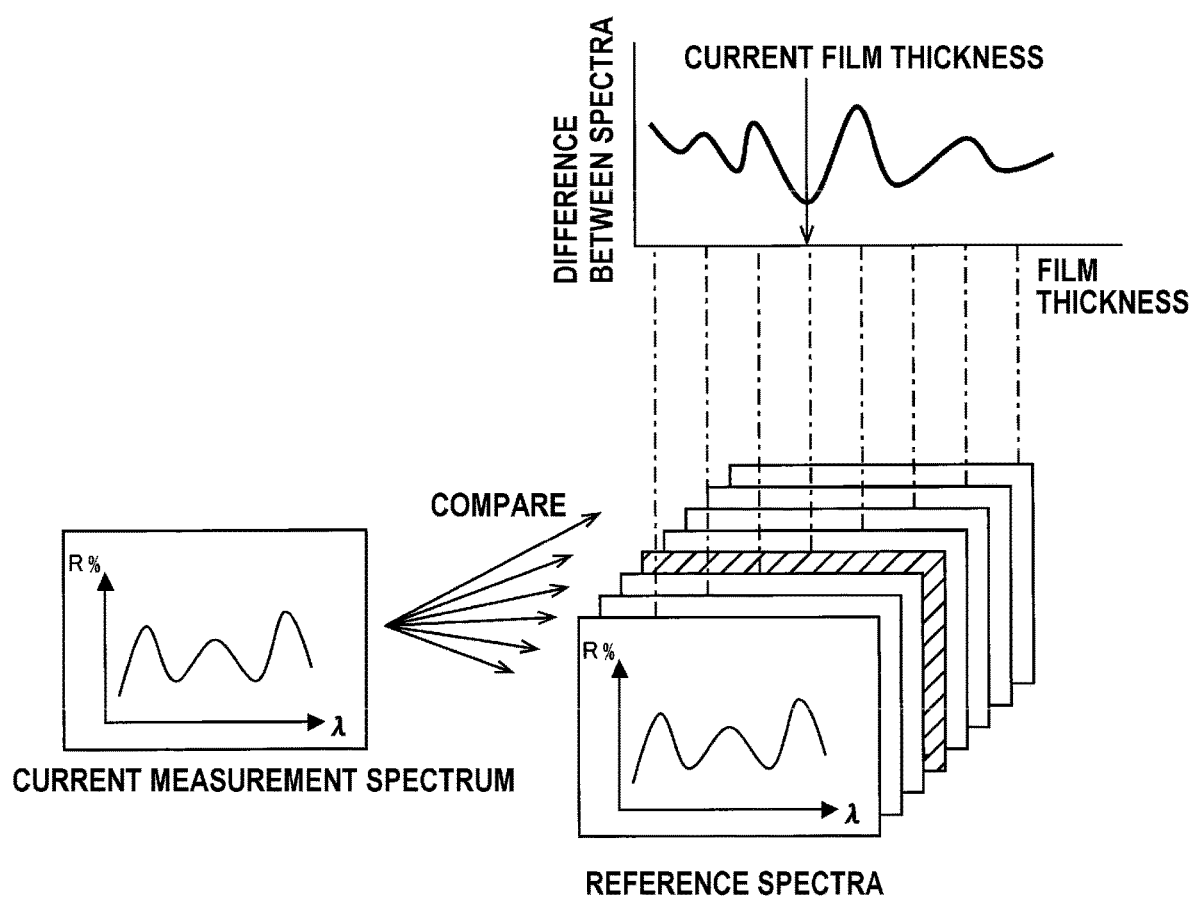
FIG. 7 is a diagram illustrating a process of determining a film thickness by comparing a measurement spectrum with a plurality of reference spectra.

FIG. 7 is a diagram illustrating a process of determining the film thickness from the comparison between the measurement spectrum and the plurality of reference spectra. The spectrum processing device 49 compares the measurement spectrum, which is produced when the wafer is being polished, with the plurality of reference spectra to determine a reference spectrum which is closest in shape to the measurement spectrum, and determine a film thickness associated with the determined reference spectrum. The reference spectrum which is closest in shape to the measurement spectrum is a spectrum with the smallest difference in the relative reflectance between the reference spectrum and the measurement spectrum.

The plurality of reference spectra are those obtained in advance when polishing a reference wafer having a multilayer structure which is the same as that of the wafer W which is an object of polishing (hereinafter, the wafer W to be polished may be referred to as target wafer or target substrate). Each reference spectrum is associated with a film thickness at a point in time when that reference spectrum is obtained. Specifically, each reference spectrum is obtained at a different film thickness, and the plurality of reference spectra correspond to different film thicknesses. Therefore, the current film thickness of the wafer W can be determined by identifying a reference spectrum which is closest in shape to the measurement spectrum.

An example of a process of obtaining the plurality of reference spectra will be described below. First, a reference wafer having a multilayer structure, which is the same as that of the target wafer W, is prepared. The reference wafer is transported to a not-shown film-thickness measuring module, which then measures an initial film thickness of the reference wafer. Subsequently, the reference wafer is transported to the polishing apparatus shown in FIG. 1, where the reference wafer is polished while slurry as the polishing liquid is supplied onto the polishing pad 2. The reference wafer is polished at a constant polishing rate (which may also be referred to as removal rate), i.e., under constant polishing conditions. During polishing of the reference wafer, as described previously, the light is directed to the surface of the reference wafer, and a spectrum (i.e., a reference spectrum) of reflected light from the reference wafer is produced. The reference spectrum is obtained each time the polishing table 3 makes one revolution. Therefore, a plurality of reference spectra are obtained during the polishing process of the reference wafer. After the polishing process of the reference wafer is terminated, the reference wafer is transported again to the aforementioned film-thickness measuring module, which then measures a film thickness (i.e., a final film thickness) of the polished reference wafer.

Figure 8:
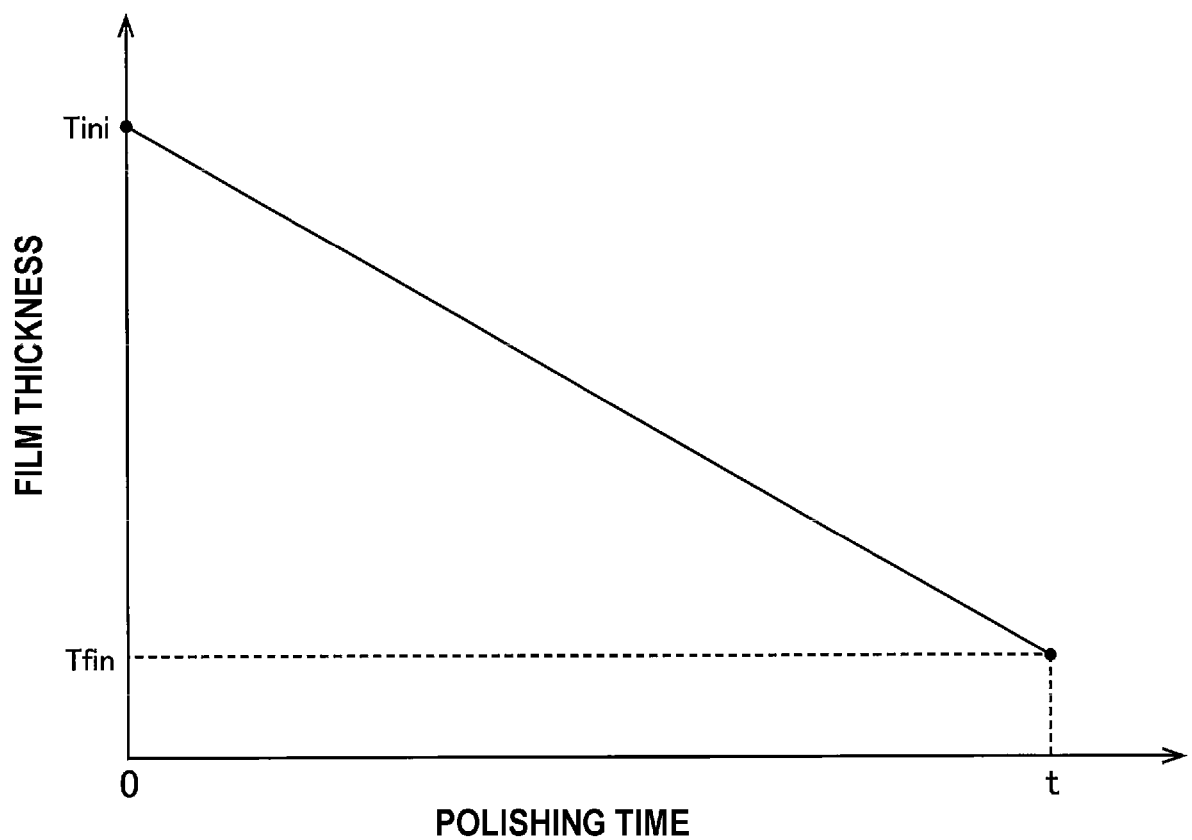
FIG. 8 is a graph showing a relationship between film thickness of a reference wafer and polishing time.

FIG. 8 is a graph showing a relationship between film thickness of the reference wafer and polishing time. In the case where a polishing rate of the reference wafer is constant, as shown in FIG. 8, the film thickness linearly decreases with the polishing time. In other words, the film thickness can be expressed with use of a linear function which includes the polishing time as a variable. The polishing rate can be calculated by dividing a difference between initial film thickness Tini and final film thickness Tfin by polishing time t at which the final film thickness Tfin is reached.

Since the reference spectrum is periodically obtained each time the polishing table 3 makes one revolution, a polishing time at which each reference spectrum was obtained can be calculated from a rotational speed and the number of rotations of the polishing table 3. Alternatively, it is possible to more precisely measure a time from a point in time when polishing of the reference wafer is started until each reference spectrum is obtained. Furthermore, it is possible to calculate a film thickness, corresponding to each reference spectrum, from a polishing time at which that reference spectrum was obtained. In this manner, a plurality of reference spectra corresponding respectively to different film thicknesses are obtained. Each reference spectrum can be associated (or connected) with a corresponding film thickness. Therefore, the spectrum processing device 49 can identify a reference spectrum which is closest in shape to a measurement spectrum while a wafer is being polished, and can determine a current film thickness from a film thickness that has been associated with the identified reference spectrum.

The spectrum of the reflected light varies in accordance with the film thickness. Consequently, basically, if the film thickness remains unchanged, the spectrum also remains unchanged. However, even if the film thickness is the same, the spectrum may change due to a difference in structure of an underlying layer existing beneath the film to be polished. The structure of the underlying layer may vary from wafer to wafer. Such a difference in the structure of the underlying layer prevents accurate measuring of the film thickness.

Figure 9:
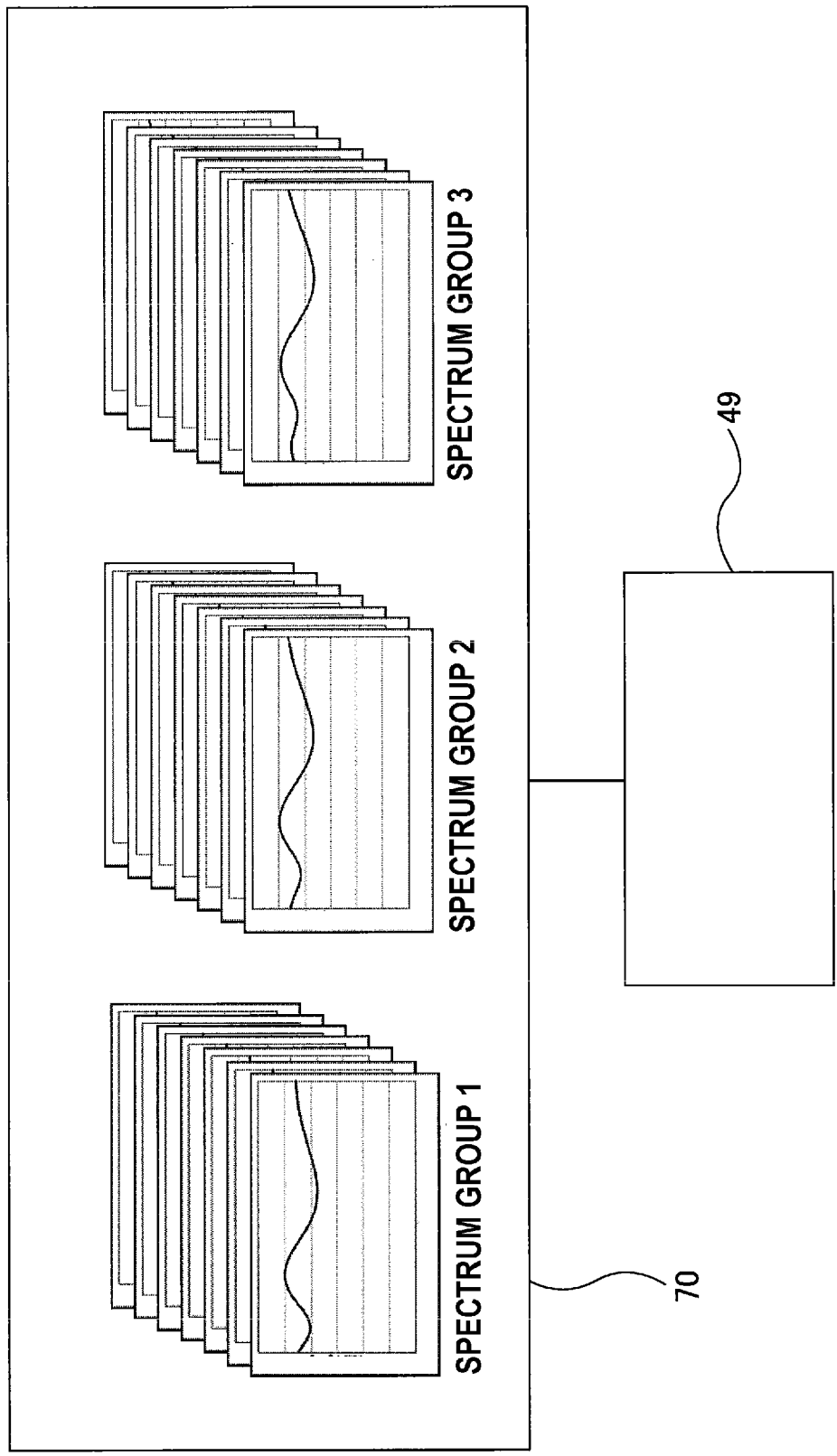
FIG. 9 is a schematic diagram showing a data server storing a plurality of spectrum groups therein.

In order to eliminate an influence of such a change in the spectrum caused by the difference in the structure of the underlying layer, the spectrum processing device 49 is configured to determine a film thickness using a plurality of spectrum groups which have been obtained during polishing of a plurality of reference wafers having different structures of underlying layers. Each of the plurality of spectrum groups includes a plurality of reference spectra. FIG. 9 is a schematic view showing the data server 70 in which the plurality of spectrum groups are stored. The plurality of spectrum groups correspond to a plurality of reference wafers, respectively, which have different structures of underlying layers. A plurality of reference spectra contained in each spectrum group are reference spectra obtained using one of the above-mentioned plurality of the reference wafers.

The spectrum processing device 49 selects one spectrum group from the plurality of spectrum groups, compares a spectrum of reflected light from a wafer W to be polished (i.e., a measurement spectrum) with a plurality of reference spectra contained in the selected spectrum group, and determines a current film thickness of the wafer W based on a reference spectrum which is closest in shape to the spectrum of the reflected light (i.e., the measurement spectrum).

Instead of the above-discussed embodiment using the reference spectra, in one embodiment, as explained below, the spectrum processing device 49 may perform Fourier transform process (typically fast Fourier transform process) on the spectrum of the reflected light from the wafer W being polished (i.e., the measurement spectrum) to produce a frequency spectrum and determine a film thickness of the wafer W from the frequency spectrum.

Figure 10:
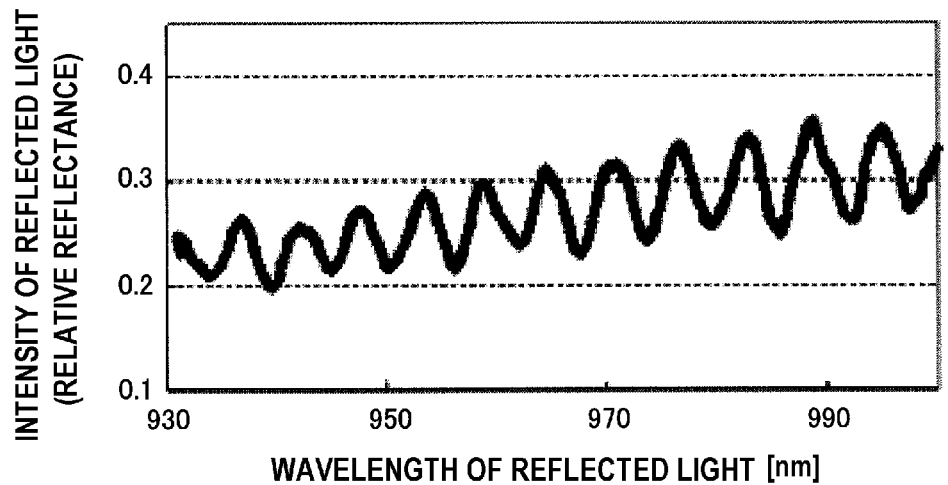
FIG. 10 is a diagram showing an example of a spectrum of reflected light from a wafer (i.e., a measurement spectrum)
Figure 11:
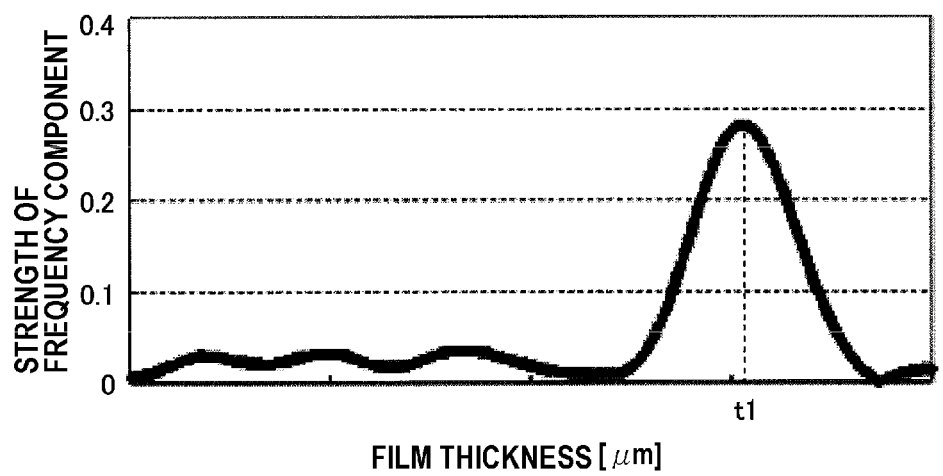
FIG. 11 is a graph showing a frequency spectrum obtained by performing a Fourier transform process on the measurement spectrum shown in FIG. 10.

FIG. 10 is a view showing one example of the spectrum of the reflected light from the wafer W (i.e., measurement spectrum), and FIG. 11 is a graph showing the frequency spectrum obtained by performing the Fourier transform process on the measurement spectrum shown in FIG. 10. In FIG. 11, vertical axis represents strength of a frequency component contained in the measurement spectrum, and horizontal axis represents film thickness. Strength of a frequency component corresponds to amplitude of the frequency component which is expressed as sine wave. A frequency component contained in the measurement spectrum is converted into a film thickness with use of a predetermined relational expression, so that the frequency spectrum as shown in FIG. 11 is produced. This frequency spectrum represents a relationship between the film thickness and the strength of the frequency component. The above-mentioned predetermined relational expression is a linear function representing the film thickness and having the frequency component as variable. This linear function can be obtained from actual measurement results of film thickness, an optical film-thickness measurement simulation, theoretical formula, etc.

In the graph shown in FIG. 11, a peak of the strength of the frequency component appears at a film thickness t1. In other words, the strength of the frequency component becomes maximum at the film thickness of t1. Specifically, this frequency spectrum indicates that the film thickness of the wafer W is t1. In this manner, the spectrum processing device 49 determines the film thickness corresponding to a peak of the strength of the frequency component.

The recipe evaluation device 75 shown in FIG. 1 includes a memory 75a storing therein a program for determining an optimum operation recipe for the optical film-thickness measuring device 40, and a processor 75b (GPU or CPU, etc.) that performs arithmetic operations according to instructions contained in the program. The processor 75b performs an arithmetic operation for determining an optimum operation recipe from a plurality of preset operation recipes based on an evaluation calculation formula (which will be described later). The recipe evaluation device 75 includes at least one computer.

The recipe evaluation device 75 is coupled to the data server 70. As described above, the data server 70 includes the storage device 70a that stores therein data of a plurality of spectra of reflected light which are obtained when a plurality of wafers are polished. The data server 70 includes at least one computer. The data server 70 may be an edge server coupled to the recipe evaluation device 75 by a communication line, or a cloud server coupled to the recipe evaluation device 75 by a network, such as the Internet, or a fog computing device (gateway, fog server, router, etc.) installed in a network coupled to the recipe evaluation device 75. The data server 70 may be a plurality of servers coupled by a network, such as the Internet. For example, the data server 70 may be a combination of an edge server and a cloud server.

Next, operation of the recipe evaluation device 75 will be described. The recipe evaluation device 75 includes at least one computer configured to determine an optimum operation recipe for the optical film-thickness measuring device 40. The operation recipe is configured to control the operation of the optical film-thickness measuring device 40, particularly the operation of the spectrum processing device 49. The operation recipe includes at least two of a plurality of recipe parameters described below.

(i) Time width for calculating a moving average of spectra
(ii) The number of data points for use in calculating a spatial average of spectra
(iii) Parameters of a filter applied to spectrum
(iv) Normalization parameter for normalizing spectrum
(v) Wavelength range of spectrum for use in film thickness determination
(vi) The number of a spectrum group that contains reference spectra for use in film thickness determination Hereinafter, each of the recipe parameters will be described in detail.

(i) Time Width

During polishing of the wafer W, each time the polishing table 3 makes one rotation, the light is directed from the optical sensor head 7 to the wafer W, and the reflected light from the wafer W is received by the optical sensor head 7. The intensity of the reflected light at each of the wavelengths is measured by the spectrometer 47, the spectrum processing device 49 produces a spectrum of the reflected light from the intensity measurement data of the reflected light, and determines a current film thickness of the wafer W based on the spectrum. The moving average of the spectra is an average of a plurality of spectra used to determine the current film thickness of the wafer W at a certain measurement point on the wafer W. The time width of the moving average is a time width used to calculate a moving average of a plurality of spectra. This time width is represented by the number of rotations of the polishing table 3. For example, if the time width is three, the spectrum processing device 49 produces one spectrum from the reflected light obtained at a certain measurement point on the wafer W while the polishing table 3 rotates three times, and determines a film thickness of the wafer W from this spectrum.

(ii) Number of Data Points

The data points are used to calculate a spatial average of a plurality of spectra obtained during polishing of the wafer W. The spatial average of the plurality of spectra is an average of a plurality of spectra of the reflected light from a plurality of measurement points on the wafer W. Specifically, the spectrum processing device 49 calculates an average of intensity measurement data of reflected light obtained at a plurality of measurement points, and produces one spectrum from the average of intensity measurement data. As shown in FIG. 3, during polishing of the wafer W, the optical sensor head 7 moves across the surface of the wafer W on the polishing pad 2 every time the polishing table 3 makes one rotation, while the optical sensor head 7 irradiates the measurement points MP on the wafer W with the light and receives the reflected light from the wafer W. The number of data points is the number of measurement points MP used to produce one spectrum. For example, if the number of data points is three, the spectrum processing device 49 creates one spectrum from the intensity measurement data of the reflected light obtained at three measurement points MP.

(iii) Filter Parameters

The spectrum processing device 49 has a filter (not shown) for removing noise contained in the spectrum produced. Noise is an unnecessary frequency component contained in the spectrum. The parameters of the filter include a parameter for determining a type of filter to be used, and a parameter for determining a pass band or a stop band. Types of filter to be used include low pass filter, high pass filter, band pass filter, and band stop filter.

(iv) Normalization Parameter for Normalizing Spectrum

The normalization parameter is a parameter for determining a normalization method of normalizing entire spectrum. There are two normalization methods as follows.

The first normalization method is a method of adjusting overall level (intensity of reflected light) of a spectrum. A spectrum is produced based on the reflected light from the wafer. Therefore, overall level of the spectrum may change depending on transmission path of the reflected light or an intensity of the light emitted by the light source 44 (see FIG. 2). Therefore, in order to adjust the overall level of the spectrum, the spectrum processing device 49 normalizes the spectrum by dividing a level at each of the wavelengths by an average of all levels of the spectrum.

The second normalization method is a method of correcting an entire inclination of a spectrum. As shown in FIG. 10, the entire spectrum may be inclined. In order to correct such an inclination of the spectrum, the spectrum processing device 49 determines an approximate line of the spectrum by a least squares method or the like, and divides each level (intensity of reflected light) on the spectrum by a corresponding level (intensity of reflected light) on the approximate line to thereby normalize the spectrum.

The normalization parameter is a parameter for selecting use of the first normalization method for overall level adjustment of the spectrum, use of the second normalization method for spectrum inclination correction, use of both, or use of neither the first normalization method nor the second normalization method.

(v) Wavelength Range of Spectrum

A film thickness of a wafer is determined based on a spectrum of reflected light from the wafer. The wavelength range of the spectrum for use in determining the film thickness is defined by a lower limit and an upper limit that have been set in the operation recipe.

(vi) Reference Spectrum Group Number

As described with reference to FIG. 7, in one embodiment, the spectrum processing device 49 determines a film thickness of a wafer by comparing a measurement spectrum with a plurality of reference spectra. Specifically, the spectrum processing device 49 compares the measurement spectrum produced during polishing of the wafer with the plurality of reference spectra to determine a reference spectrum having the closest shape to the measurement spectrum, and to determine a film thickness associated with the determined reference spectrum. The reference spectrum is contained in one of the plurality of spectrum groups stored in the data server 70, as shown in FIG. 9. The spectrum processing device 49 selects one spectrum group from the plurality of spectrum groups, compares the measurement spectrum produced during polishing of the wafer with a plurality of reference spectra contained in the selected spectrum group, and determines a reference spectrum that is closest in shape to the measurement spectrum. One spectrum group selected from the plurality of spectrum groups is a spectrum group having the number that has been set in the operation recipe. For example, if the number set in the operation recipe is 2, the spectrum processing section 49 selects a spectrum group of No. 2.

The recipe evaluation device 75 stores, in the memory 75a, a plurality of parameter sets each including a plurality of recipe parameters constituting an operation recipe. Each parameter set includes at least two of the recipe parameters (i) to (vi) described above. In one example, each parameter set includes all of the recipe parameters (i) to (vi) described above. A specific numerical value of the recipe parameter contained in each parameter set is a preset value, but the numerical value can be arbitrarily changed by a user.

The recipe evaluation device 75 selects an optimum parameter set from the plurality of parameter sets stored in the memory 75a as follows. First, the recipe evaluation device 75 performs a simulation of a change in film thickness with lapse of polishing time with use of both the plurality of recipe parameters contained in each parameter set and the data of reference spectra stored in the data server 70. The data of reference spectra stored in the data server 70 is data of spectra that have been obtained when a plurality of wafers are actually polished.

The recipe parameters (i) to (v) affect the shape of the spectrum (i.e., the measurement spectrum) itself of the reflected light, and the recipe parameter (vi) affects reference spectra to be compared with the spectrum of the reflected light (i.e., the measurement spectrum). Therefore, these recipe parameters (i) to (vi) affect the film thickness of the wafer that is determined based on the spectrum of the reflected light and the reference spectrum.

In the simulation of the change in film thickness, the change in film thickness with the elapse of polishing time is calculated from a change in spectrum of reflected light corresponding to a change in film thickness with the elapse of polishing time of a wafer that has been previously polished in the past. Specifically, the recipe evaluation device 75 accesses the data server 70 and obtains from the data server 70 a plurality of reference spectra that have been obtained during actual polishing of the wafer (i.e., obtained when the film thickness is changing). The recipe evaluation device 75 then processes these reference spectra based on the recipe parameters to produce estimated spectra, and determines a plurality of film thicknesses from the estimated spectra.

The recipe evaluation device 75 has an evaluation calculation formula for evaluating the manner of change in film thickness obtained by the above-described simulation. This evaluation calculation formula is stored in the memory 75a. The recipe evaluation device 75 inputs a plurality of index values for evaluating the manner of change in film thickness obtained by the simulation into the evaluation calculation formula, and calculates a plurality of comprehensive evaluation values for the respective parameter sets. The evaluation calculation formula includes the plurality of index values for evaluating the manner of change in film thickness, a plurality of target values for the plurality of index values, and a plurality of weighting factors that are respectively multiplied by differences between the plurality of target values and the plurality of index values.

The plurality of index values included in the evaluation calculation formula are a first index value, a second index value, a third index value, a fourth index value, and a fifth index value described below. In this embodiment, five index values are included in the evaluation calculation formula, but in one embodiment, only one, or two, or three, or four of the five index values may be included in the evaluation calculation formula.

The first index value is an index value indicating evaluation for invariance of a shape of a film-thickness profile of the wafer with respect to polishing time. The film-thickness profile of the wafer shows a film-thickness distribution along a radial direction of the wafer.

Figure 12:
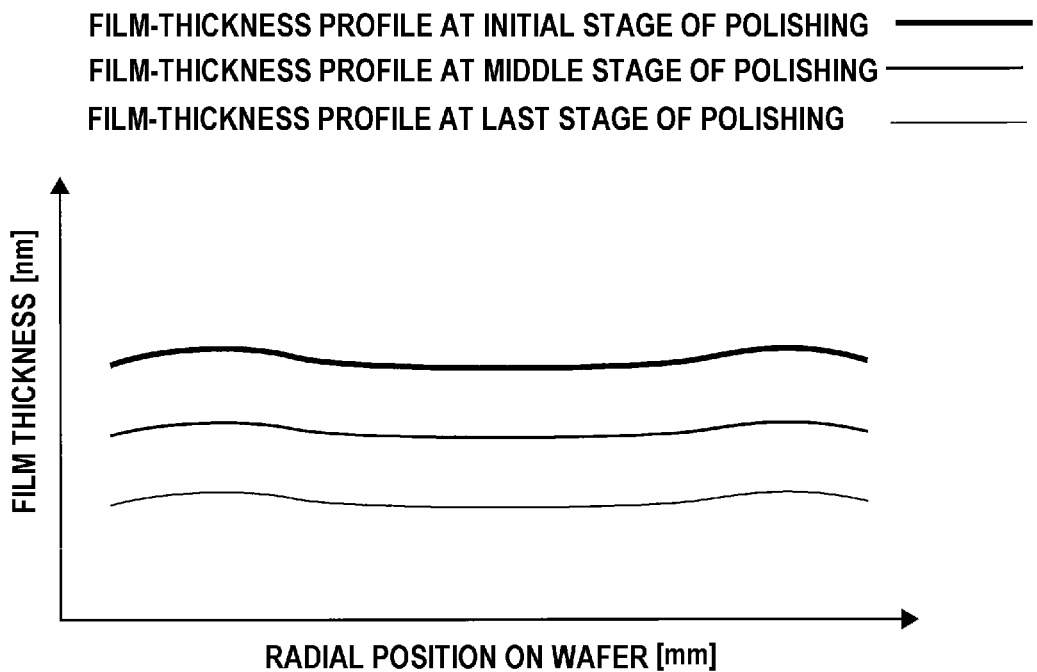
FIG. 12 is a diagram showing an example of a change in shape of film-thickness profile of a wafer according to polishing time.
Figure 13:
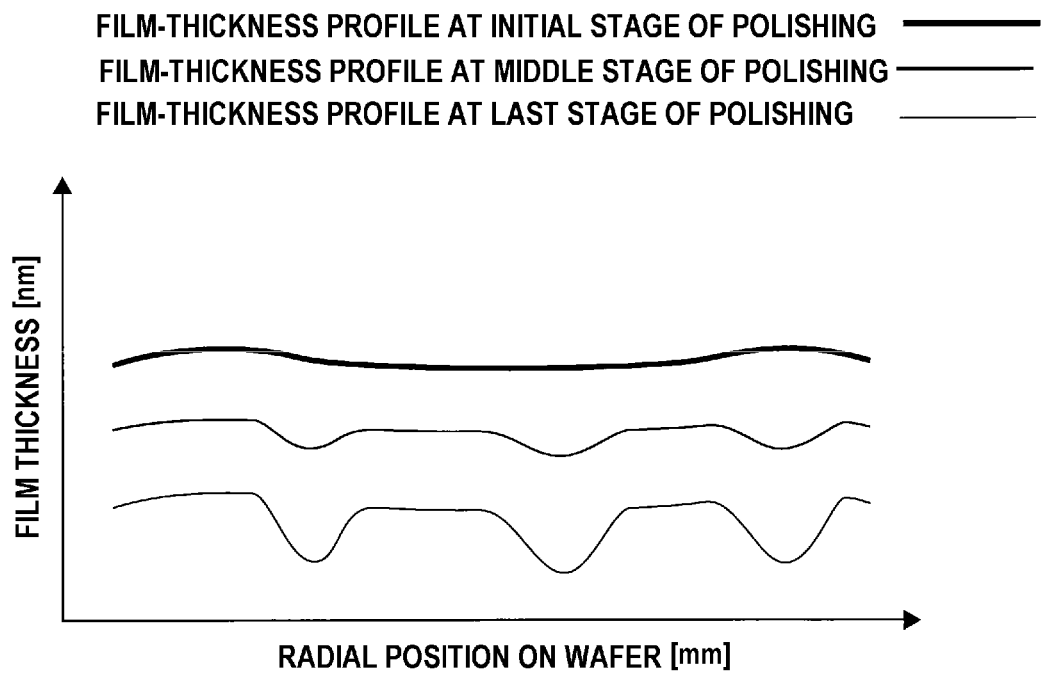
FIG. 13 is a diagram showing another example of a change in shape of film-thickness profile of a wafer according to polishing time.

FIG. 12 is a diagram showing an example of a change in shape of the film-thickness profile of the wafer with respect to polishing time. As shown in FIG. 12, the shape of the film-thickness profile of the wafer remains unchanged regardless of the polishing time, as long as polishing conditions of the wafer do not change. FIG. 13 is a diagram showing another example of a change in shape of the film-thickness profile of the wafer with respect to polishing time. In the example shown in FIG. 13, the shape of the film-thickness profile of the wafer changes with polishing time even though the polishing conditions of the wafer are unchanged.

The first index value is a rate of change in shape of the film-thickness profile obtained from the simulation result. The rate of change in shape of the film-thickness profile is a rate of change in shape of the film-thickness profile with respect to polishing time. The rate of change in shape of the film-thickness profile shown in FIG. 12 is close to zero, whereas the rate of change in shape of the film-thickness profile shown in FIG. 13 is a relatively large numerical value.

The second index value is an index value indicating evaluation for smallness of a difference between an actually-measured value of a film thickness measured by a film-thickness measuring module and a film thickness obtained by the above simulation. Prior to polishing of a wafer, the wafer is usually transported to a stand-alone type film-thickness measuring module (not shown), where an initial film thickness of the wafer is measured. Further, after polishing of the wafer, the wafer is transported to the film-thickness measuring module again, and a film thickness of the polished wafer is measured. The stand-alone type film-thickness measuring module is configured to measure the film thickness in a state such that the wafer is stationary and slurry is not present. Accordingly, as compared with the optical film-thickness measuring device 40 that measures a film thickness during polishing of a wafer, the stand-alone type film-thickness measuring module can more accurately measure a film thickness.

Figure 14:
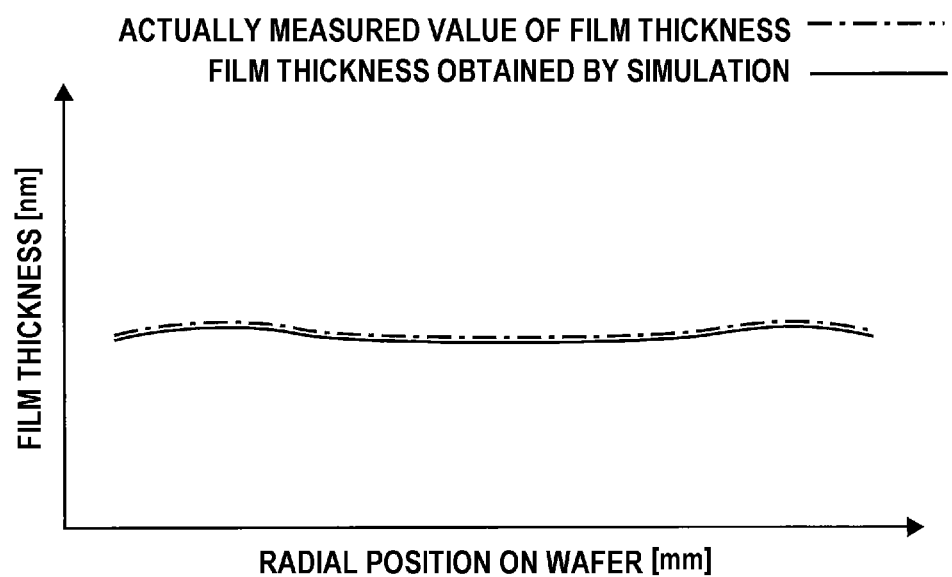
FIG. 14 is a diagram showing an example of actually measured film thickness and film thickness obtained by simulation.
Figure 15:
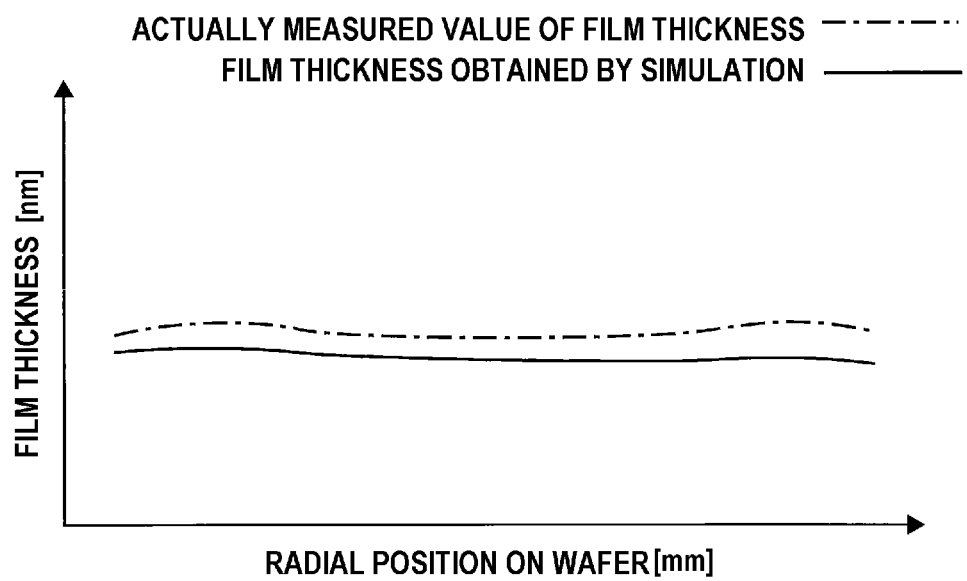
FIG. 15 is a diagram showing another example of actually measured film thickness and film thickness obtained by simulation.

FIG. 14 is a diagram showing an example of the actually-measured value of the film thickness obtained by the film-thickness measuring module and the film thickness obtained by the above simulation. In this example, the difference between the actually-measured value of the film thickness and the film thickness obtained by the above simulation is small. In other words, the film thickness obtained by the above simulation is close to the actually-measured value of the film thickness. FIG. 15 is a diagram showing another example of the actually-measured value of the film thickness obtained by the film-thickness measuring module and the film thickness obtained by the above simulation. In this example, the difference between the actually-measured value of the film thickness and the film thickness obtained by the simulation is larger than that in the example shown in FIG. 14.

The third index value is an index value indicating evaluation for goodness of fit in shape between the spectrum produced in the above simulation and the reference spectrum stored in the data server 70. As described with reference to FIG. 7, in one embodiment, the spectrum processing device 49 determines the film thickness by comparing a spectrum produced in the simulation (hereinafter, referred to as an estimated spectrum) with a plurality of reference spectra. Specifically, the spectrum processing device 49 determines a reference spectrum having the closest shape to the estimated spectrum, and determines a film thickness associated with the determined reference spectrum.

Figure 16:
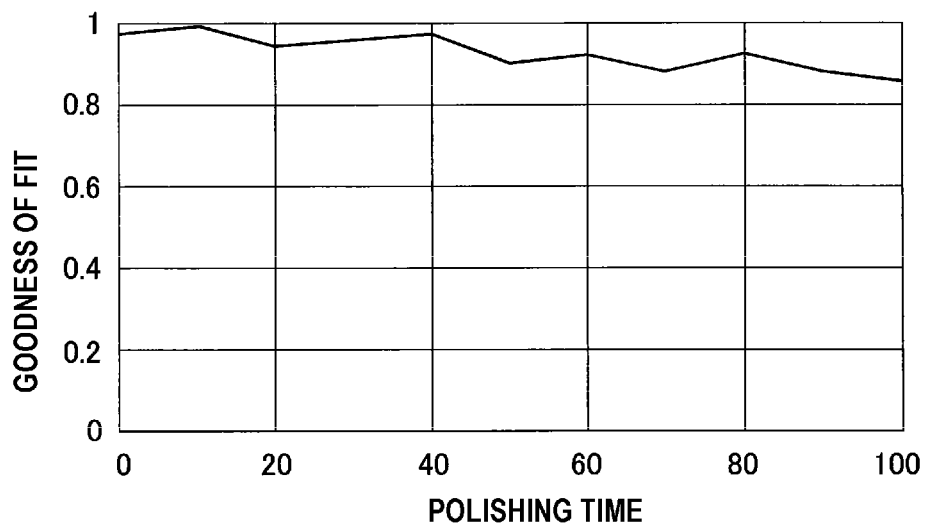
FIG. 16 is a diagram showing an example of a high goodness of fit in shape between an estimated spectrum and a reference spectrum.
Figure 17:
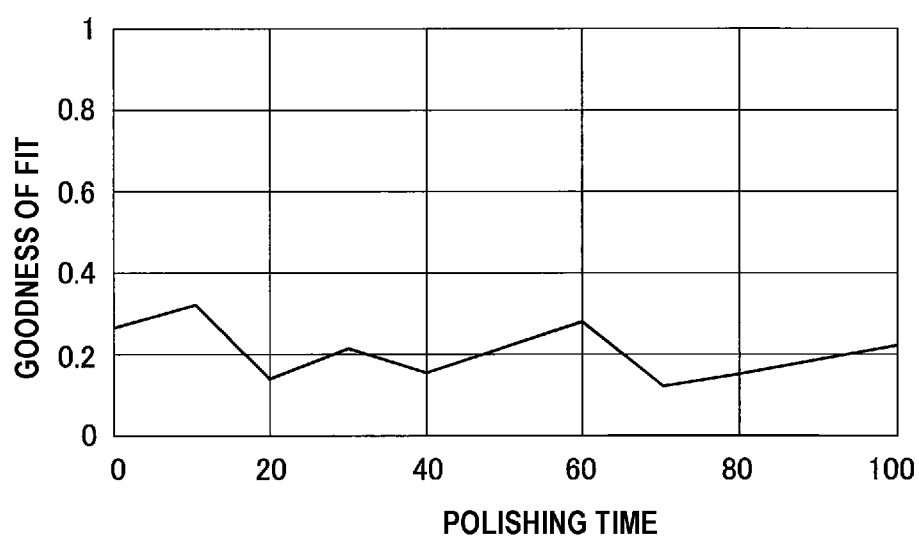
FIG. 17 is a diagram showing an example of a low goodness of fit in shape between an estimated spectrum and a reference spectrum.

The goodness of fit in shape between the estimated spectrum and the reference spectrum is represented by a numerical value within a range of 0 to 1. FIG. 16 is a diagram showing an example in which the goodness of fit in shape between the estimated spectrum and the reference spectrum is high, and FIG. 17 is a diagram showing an example in which the goodness of fit in shape between the estimated spectrum and the reference spectrum is low. The higher the goodness of fit, the higher the reliability of the film thickness. Therefore, the reliability of the film thickness in the example shown in FIG. 16 is high, while the reliability of the film thickness in the example shown in FIG. 17 is low.

The fourth index value is an index value indicating evaluation for a quality factor (Q factor) of a film thickness determined based on a spectrum (i.e., an estimated spectrum) produced in the above-discussed simulation. Algorithm for determining the film thickness based on the estimated spectrum differs between the embodiment shown in FIG. 7 and the embodiment shown in FIG. 11, but in both embodiments, a graph is used for the film thickness determination. The quality factor (Q factor) of the film thickness is determined based on steepness of a peak or bottom of the graph. In general, the steeper the peak or bottom of the graph, the higher the quality factor (Q factor).

Figure 18:
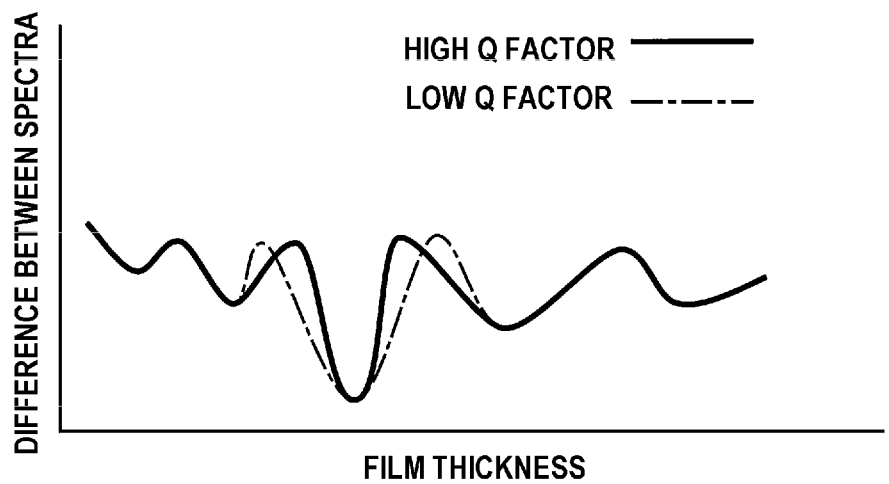
FIG. 18 is a graph used in a film-thickness determination algorithm described with reference to FIG. 7.

FIG. 18 is a graph used in the film-thickness determination algorithm described with reference to FIG. 7. More specifically, horizontal axis of FIG. 18 represents film thickness associated with a plurality of reference spectra, and vertical axis represents difference in intensity of reflected light between the estimated spectrum and the reference spectrum. The steeper the bottom of the graph shown in FIG. 18, the higher the quality factor (Q factor) (i.e., the higher the reliability of the film thickness).

Figure 19:
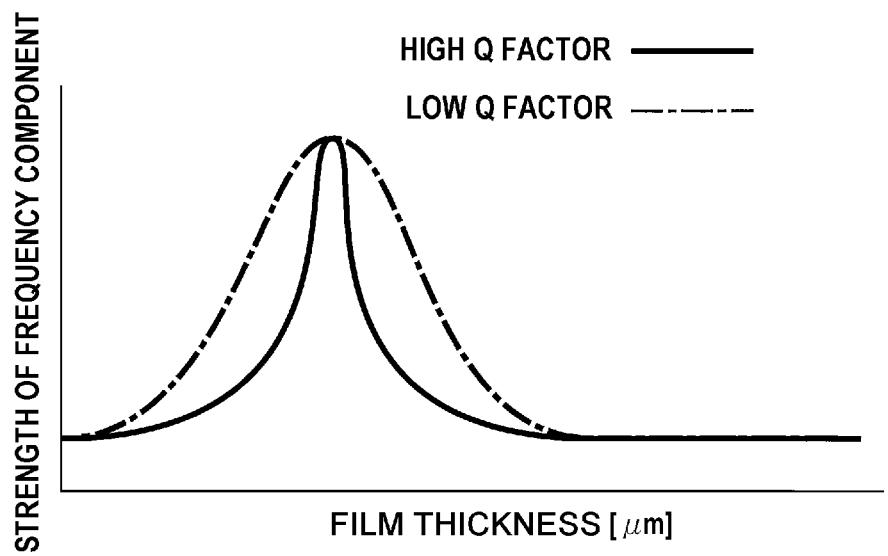
FIG. 19 is a graph showing a frequency spectrum used in a film-thickness determination algorithm described with reference to FIG. 11.

FIG. 19 is a graph showing a frequency spectrum used in the film-thickness determination algorithm described with reference to FIG. 11. Horizontal axis of FIG. 19 represents film thickness, and vertical axis represents strength of frequency component contained in the estimated spectrum. The steeper the peak of the graph shown in FIG. 19, the higher the quality factor (Q factor) (i.e., the higher the reliability of the film thickness).

The fifth index value is an index value indicating evaluation for a linearity of change in film thickness along polishing time. A film thickness of a wafer decreases at a constant rate with polishing time, as long as polishing conditions of the wafer are constant. In other words, a polishing rate of the wafer (also referred to as a removal rate) is constant during polishing of the wafer.

Figure 20:
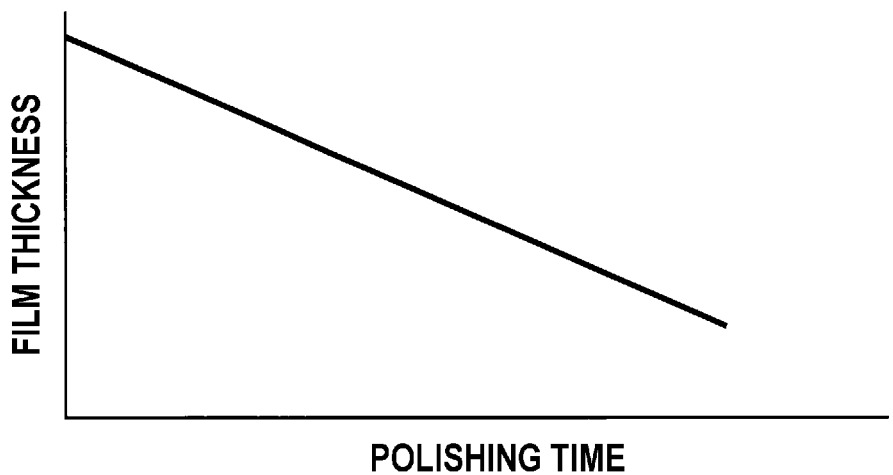
FIG. 20 is a graph showing an example in which the film thickness linearly decreases with polishing time.
Figure 21:
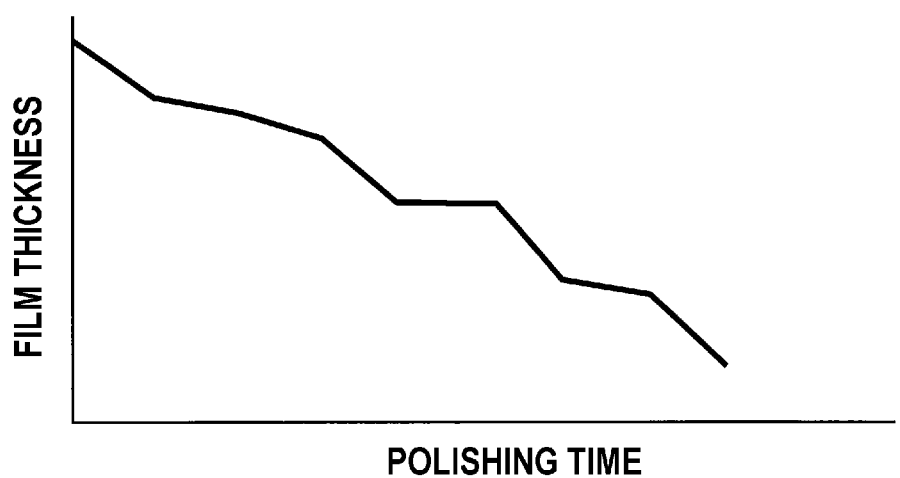
FIG. 21 is a graph showing an example in which the film thickness does not decrease linearly with polishing time.

FIG. 20 is a graph showing an example in which the film thickness linearly decreases with polishing time. In the example of FIG. 20, the polishing rate of the wafer is constant. FIG. 21 is a graph showing an example in which the film thickness does not decrease linearly with polishing time. In the example of FIG. 21, the polishing rate of the wafer changes, although the polishing conditions of the wafer are constant.

The recipe evaluation device 75 inputs the first index value, the second index value, the third index value, the fourth index value, and the fifth index value, which are obtained from the simulation result of the change in film thickness, into the following evaluation calculation formula to calculate a comprehensive evaluation value.

$$F = w1 \times (|aT-ak|) + w2 \times (|bT-bk|) + w3 \times (|cT-ck|) + w4 \times (|dT-dk|) + w5 \times (|eT-ek|) \quad (2)$$

where, ak is the first index value, aT is a target value for the first index value, w1 is a first weighting factor, bk is the second index value, bT is a target value for the second index value, w2 is a second weighting factor, ck is the third index value, cT is a target value for the third index value, w3 is a third weighting factor, dk is the fourth index value, dT is a target value for the fourth index value, w4 is a fourth weighting factor, ek is the fifth index value, eT is a target value for the fifth index value, and w5 is a fifth weighting factor.

The above-described evaluation calculation formula is stored in the memory 75a of the recipe evaluation device 75. The target values aT to eT and the weighting factors w1 to w5 are preset by a user and stored in the memory 75a of the recipe evaluation device 75.

The recipe evaluation device 75 performs the simulation of the change in film thickness, and calculates the first index value, the second index value, the third index value, the fourth index value, and the fifth index value from the simulation result. The recipe evaluation device 75 inputs these index values into the above-described evaluation calculation formula to calculate the comprehensive evaluation value. The recipe evaluation device 75 evaluates each parameter set including a plurality of recipe parameters based on the comprehensive evaluation value. Specifically, the recipe evaluation device 75 calculates comprehensive evaluation values for a plurality of parameter sets, respectively, and determines an optimum parameter set that has resulted in the largest or smallest comprehensive evaluation value.

Figure 22:
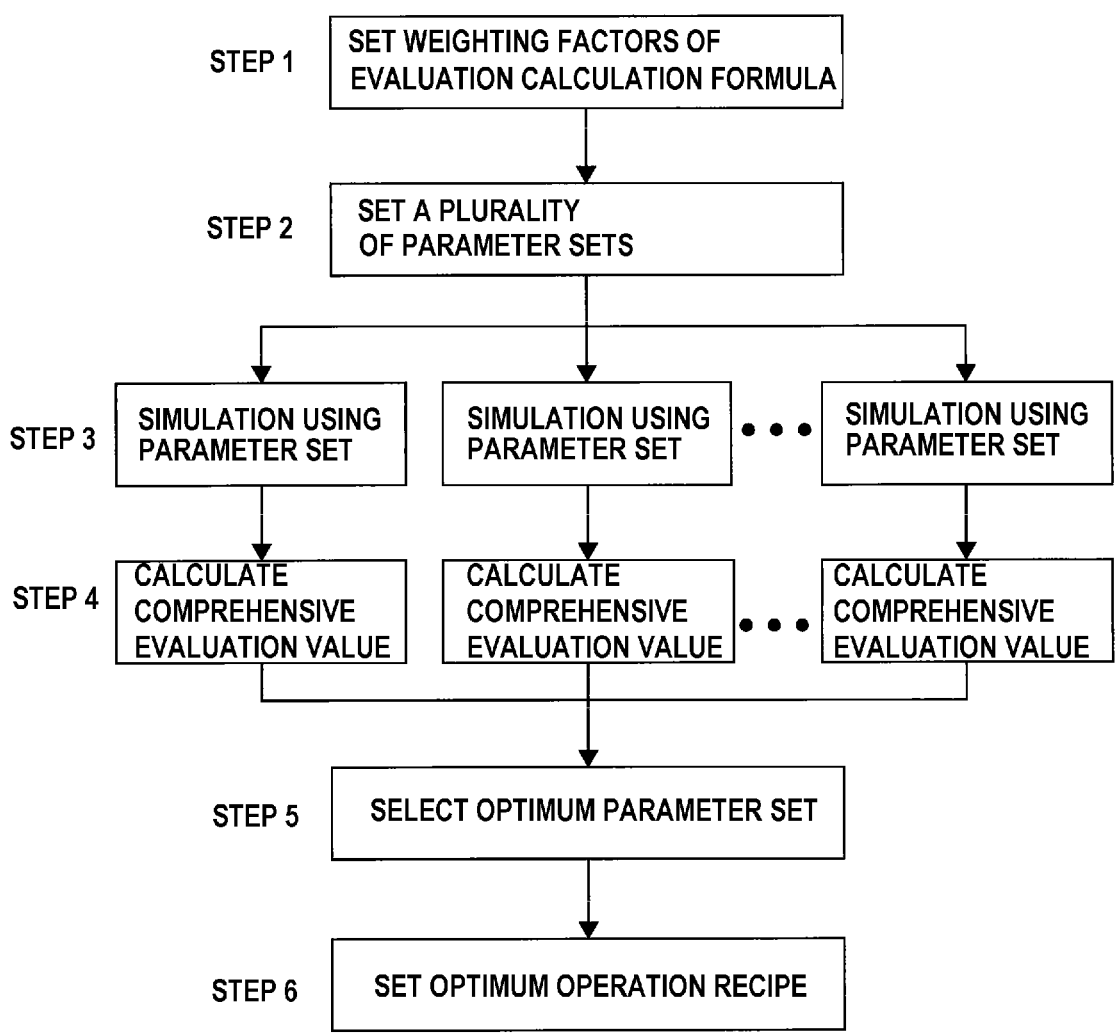
FIG. 22 is a flow chart illustrating an embodiment of a method of determining an optimum operation recipe for the optical film-thickness measuring device.

FIG. 22 is a flowchart illustrating an embodiment of a method of determining an optimum operation recipe for the optical film-thickness measuring device 40.

In step 1, the weighting factors w1 to w5 of the evaluation calculation formula are set. More specifically, the weighting factors w1 to w5 are input into the recipe evaluation device 75 via an input device (not shown) and stored in the memory 75a of the recipe evaluation device 75. A user can arbitrarily determine specific numerical values of the weighting factors w1 to w5. The weighting factors w1 to w5 once stored in the memory 75a may be used as standard weighting factors.

In step 2, a plurality of parameter sets are set. More specifically, a plurality of parameter sets are input into the recipe evaluation device 75 via an input device (not shown) and stored in the memory 75a of the recipe evaluation device 75. Numerical value(s) of at least one of the plurality of recipe parameters contained in each parameter set varies from one parameter set to another. The number of parameter sets stored in the memory 75a is arbitrarily set in advance.

In step 3, the recipe evaluation device 75 performs the simulation of change in film thickness with use of the plurality of parameter sets stored in the step 2 and the reference spectra stored in the data server 70. More specifically, in order to reduce an overall simulation time, the recipe evaluation device 75 performs simulations in parallel using the plurality of parameter sets.

In step 4, the recipe evaluation device 75 inputs the first index value, the second index value, the third index value, the fourth index value, and the fifth index value into the evaluation calculation formula to calculate a comprehensive evaluation value for each parameter set. More specifically, the recipe evaluation device 75 calculates, from the simulation result, the first index value, the second index value, the third index value, the fourth index value, and the fifth index value for each parameter set, and inputs these index values into the above-described evaluation calculation formula to calculate a comprehensive evaluation value for each parameter set.

In step 5, the recipe evaluation device 75 determines the largest one or the smallest one of the plurality of comprehensive evaluation values obtained, and selects an optimum parameter set that corresponds to the determined comprehensive evaluation value.

In step 6, the recipe evaluation device 75 establishes an optimum operation recipe composed of a plurality of recipe parameters contained in the selected parameter set, and stores the optimum operation recipe in the memory 75a. Thereafter, the polishing apparatus shown in FIGS. 1 and 2 operates the optical film-thickness measuring device 40 according to the established optimum operation recipe, and polishes the wafer W while measuring a film thickness of the wafer W by the optical film-thickness measuring device 40.

According to the present embodiment, since the comprehensive evaluation values are calculated for the plurality of parameter sets, the optimum recipe parameter can be automatically determined in a short time based on the comprehensive evaluation values, regardless of the skill of a user.

The reference spectra stored in the data server 70 are spectra that have been obtained while a plurality of wafers are being polished. These wafers have a slightly different multilayer structure. Specifically, a type and a thickness of a film forming an exposed surface of each wafer are the same, but structure of an underlying layer beneath the film is slightly different. In such a case, a spectrum of reflected light from each wafer varies, and as a result, a film thickness determined from the spectrum also varies.

Therefore, in order to determine an optimum operation recipe for a plurality of wafers, in one embodiment, the recipe evaluation device 75 repeats the simulation of change in film thickness and calculation of a comprehensive evaluation value for the plurality of wafers to obtain a plurality of comprehensive evaluation values for each parameter set, and calculates a variation in the plurality of comprehensive evaluation values for each parameter set. In one example, the variation in the plurality of comprehensive evaluation values is represented by a standard deviation. Further, the recipe evaluation device 75 selects, from the plurality of parameter sets stored in the step 2, an optimum parameter set with the smallest variation in the comprehensive evaluation values.

Further, in one embodiment, the recipe evaluation device 75 may repeat the simulation of change in film thickness and calculation of a comprehensive evaluation value for the plurality of wafers to obtain a plurality of comprehensive evaluation values for each parameter set, calculate a sum of the plurality of comprehensive evaluation values for each parameter set, and select, from the plurality of parameter sets stored in the step 2, an optimum parameter set with the largest or smallest sum of the comprehensive evaluation values. In this case, the following evaluation calculation formula is used.

$$F = \Sigma_{k=1}^{N}[w1\times(|aT-ak|)+w2\times(|bT-bk|)+w3\times(1cT-ck|)+w4\times(|dT-dk|)+w5\times(|eT-ek|)] \quad (3)$$

where, N is the number of wafers. Other symbols are the same as the symbols in the above formula (2).

The above-described evaluation calculation formula is stored in the memory 75a of the recipe evaluation device 75. The target values aT to eT and the weighting factors w1 to w5 are preset by a user and stored in the memory 75a of the recipe evaluation device 75. The number N of wafers is the number of wafers used to obtain the reference spectra stored in the data server 70.

According to the present embodiment, since the sum of the comprehensive evaluation values is calculated, an influence of a minute difference in multilayer structure between wafers on the determination of the optimum parameter set can be reduced.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A method of determining an optimum operation recipe for an optical film-thickness measuring device configured to measure a film thickness of a substrate during polishing of the substrate, comprising:

storing in a memory a plurality of parameter sets each including a plurality of recipe parameters constituting an operation recipe;

performing simulation of change in film thickness with polishing time with use of the plurality of parameter sets and data of reference spectra of reflected light from a polished substrate, wherein the simulation of change in film thickness includes processing the reference spectra based on the plurality recipe parameters to produce estimated spectra and determining a plurality of film thicknesses from the estimated spectra, the reference spectra being stored in a data server, and wherein the plurality of recipe parameters includes at least two of:

time width for calculating a moving average of spectra obtained during polishing of a substrate;

the number of data points for use in calculating a spatial average of spectra obtained during polishing of a substrate;

parameters of a filter applied to spectra obtained during polishing of a substrate;

wavelength range of spectrum for use in film thickness determination; and the number of a spectrum group that contains reference spectra for use in film thickness determination;

inputting at least one index value for evaluating a manner of the change in film thickness into an evaluation calculation formula to calculate a plurality of comprehensive evaluation values for the plurality of parameter sets; and selecting an optimum one of the plurality of parameter sets based on the plurality of comprehensive evaluation values.

2. The method according to claim 1, wherein the evaluation calculation formula includes the at least one index value, at least one target value for the at least one index value, and at least one weighting factor multiplied by a difference between the at least one target value and the at least one index value.

3. The method according to claim 1, wherein the at least one index value comprises at least one of:

a first index value indicating evaluation for invariance of a shape of a film-thickness profile with respect to polishing time;

a second index value indicating evaluation for smallness of a difference between an actually-measured value of a film thickness measured by a film-thickness measuring module and a film thickness obtained by the simulation;

a third index value indicating evaluation for goodness of fit in shape between a spectrum produced in the simulation and a reference spectrum stored in the data server;

a fourth index value indicating evaluation for a quality factor of a film thickness determined based on a spectrum produced in the simulation; and a fifth index value indicating evaluation for a linearity of the change in film thickness along polishing time.

4. The method according to claim 1, wherein the reference spectra stored in the data server are spectra of reflected light that have been obtained when a plurality of substrates are actually polished.

5. The method according to claim 4, further comprising:

repeating the simulation and calculation of the comprehensive evaluation value for the plurality of substrates to obtain a plurality of comprehensive evaluation values for each parameter set; and calculating a variation in the plurality of comprehensive evaluation values for each parameter set, wherein said selecting the optimum one of the plurality of parameter sets comprises selecting, from the plurality of parameter sets, an optimum parameter set with a smallest variation in the plurality of comprehensive evaluation values.

6. The method according to claim 4, further comprising:
repeating the simulation and calculation of the comprehensive evaluation value for the plurality of substrates to obtain a plurality of comprehensive evaluation values for each parameter set; and calculating a sum of the plurality of comprehensive evaluation values for each parameter set, wherein said selecting the optimum one of the plurality of parameter sets comprises selecting, from the plurality of parameter sets, an optimum parameter set with a largest or smallest sum of the plurality of comprehensive evaluation values.

7. The method according to claim 1, wherein the reference spectra are spectra of reflected light from a substrate that is being actually polished.

8. A system for determining an optimum operation recipe for an optical film-thickness measuring device configured to measure a film thickness of a substrate during polishing of the substrate, comprising:
a recipe evaluation device including a memory storing a program therein and a processor configured to perform an arithmetic operation according to an instruction contained in the program, the memory storing therein a plurality of parameter sets each including a plurality of recipe parameters constituting an operation recipe; and
a data server storing therein data of reference spectra of reflected light from a polished substrate,
wherein the recipe evaluation device is configured to
perform simulation of change in film thickness with polishing time with use of the plurality of parameter sets and the data of the reference spectra obtained from the data server wherein the simulation of change in film thickness includes processing the reference spectra based on the recipe parameters to produce estimated spectra and determining a plurality of film thicknesses from the estimated spectra,
wherein the plurality of recipe parameters includes at least two of:
time width for calculating a moving average of spectra obtained during polishing of a substrate;
the number of data points for use in calculating a spatial average of spectra obtained during polishing of a substrate;
parameters of a filter applied to spectra obtained during polishing of a substrate;
wavelength range of spectrum for use in film thickness determination; and
the number of a spectrum group that contains reference spectra for use in film thickness determination;
input at least one index value for evaluating a manner of the change in film thickness into an evaluation calculation formula to calculate a plurality of comprehensive evaluation values for the plurality of parameter sets, and
select an optimum one of the plurality of parameter sets based on the plurality of comprehensive evaluation values.

9. The system according to claim 8, wherein the evaluation calculation formula includes the at least one index value, at least one target value for the at least one index value, and at least one weighting factor multiplied by a difference between the at least one target value and the at least one index value.

10. The system according to claim 8, wherein the at least one index value comprises at least one of:
a first index value indicating evaluation for invariance of a shape of a film-thickness profile with respect to polishing time;
a second index value indicating evaluation for smallness of a difference between an actually-measured value of a film thickness measured by a film-thickness measuring module and a film thickness obtained by the simulation;
a third index value indicating evaluation for goodness of fit in shape between a spectrum produced in the simulation and a reference spectrum stored in the data server;
a fourth index value indicating evaluation for a quality factor of a film thickness determined based on a spectrum produced in the simulation; and
a fifth index value indicating evaluation for a linearity of the change in film thickness along polishing time.

11. The system according to claim 8, wherein the reference spectra stored in the data server are spectra of reflected light that have been obtained when a plurality of substrates are actually polished.

12. The system according to claim 11, wherein the recipe evaluation device is configured to
repeat the simulation and calculation of the comprehensive evaluation value for the plurality of substrates to obtain a plurality of comprehensive evaluation values for each parameter set,
calculate a variation in the plurality of comprehensive evaluation values for each parameter set, and
select, from the plurality of parameter sets, an optimum parameter set with a smallest variation in the plurality of comprehensive evaluation values.

13. The system according to claim 11, wherein the recipe evaluation device is configured to
repeat the simulation and calculation of the comprehensive evaluation value for the plurality of substrates to obtain a plurality of comprehensive evaluation values for each parameter set,
calculate a sum of the plurality of comprehensive evaluation values for each parameter set, and
select, from the plurality of parameter sets, an optimum parameter set with a smallest sum of the plurality of comprehensive evaluation values.

14. The system according to claim 8, wherein the reference spectra are spectra of reflected light from a substrate that is being actually polished.

* * * * *